(12) United States Patent
Bando

(10) Patent No.: US 8,913,378 B2
(45) Date of Patent: Dec. 16, 2014

(54) ELECTRONIC APPARATUS AND MANUFACTURING METHOD

(75) Inventor: Makoto Bando, Inagi (JP)

(73) Assignee: Fujitsu Limited, Kawasaki (JP)

( * ) Notice: Subject to any disclaimer, the term of this patent is extended or adjusted under 35 U.S.C. 154(b) by 126 days.

(21) Appl. No.: 13/524,984

(22) Filed: Jun. 15, 2012

(65) Prior Publication Data

US 2013/0083474 A1    Apr. 4, 2013

(30) Foreign Application Priority Data

Sep. 30, 2011   (JP) .................................. 2011-217449

(51) Int. Cl.
| | | |
|---|---|---|
| *H05K 5/00* | (2006.01) | |
| *H05K 7/00* | (2006.01) | |
| *G06F 1/16* | (2006.01) | |
| *G06F 1/18* | (2006.01) | |
| *H05K 13/00* | (2006.01) | |
| *F16F 15/00* | (2006.01) | |
| *F16M 11/10* | (2006.01) | |
| *F16M 11/20* | (2006.01) | |

(52) U.S. Cl.
CPC ................ *G06F 1/16* (2013.01); *G06F 1/1601* (2013.01); *G06F 1/187* (2013.01); *H05K 7/00* (2013.01); *H05K 13/00* (2013.01); *F16F 15/00* (2013.01); *F16M 11/10* (2013.01); *F16M 11/2014* (2013.01); *G06F 2200/1612* (2013.01); *G06F 2200/1631* (2013.01); *F16M 2200/808* (2013.01)
USPC ............ 361/679.34; 361/679.33; 361/679.55; 361/679.56

(58) Field of Classification Search
CPC ....... G06F 1/16; G06F 1/1601; G06F 1/1603; G06F 1/1605; G06F 1/1607; G06F 1/1609; G06F 1/1611
USPC ............... 361/679.21, 679.33, 679.26, 679.3, 361/679.31, 679.32, 679.34, 679.35, 361/679.36, 679.37, 679.38, 679.39, 361/679.55, 679.56
See application file for complete search history.

(56) References Cited

U.S. PATENT DOCUMENTS

| | | | | |
|---|---|---|---|---|
| 6,188,569 B1 * | 2/2001 | Minemoto et al. | ........ | 361/679.33 |
| 7,355,845 B2 * | 4/2008 | Kim et al. | ................ | 361/679.33 |
| 7,626,814 B2 * | 12/2009 | Seibert et al. | ............ | 361/679.45 |
| 7,630,194 B1 * | 12/2009 | Wu | ........................... | 361/679.21 |
| 7,733,635 B2 * | 6/2010 | Sullivan | ................... | 361/679.02 |

FOREIGN PATENT DOCUMENTS

| | | |
|---|---|---|
| JP | 06-044761 A | 2/1994 |
| JP | 11-086519 A | 3/1999 |

* cited by examiner

*Primary Examiner* — Anthony Haughton
(74) *Attorney, Agent, or Firm* — Maschoff Brennan

(57) ABSTRACT

An electronic apparatus includes a main body, a hinge through which the main body is attached to a stand, a chassis including a support portion that is attached to the hinge, a vibrating component to which a bracket is attached, the vibrating component being attached to the support portion through the bracket, and a shielding member that is attached to the chassis to cover the chassis without coming into contact with the vibrating component.

11 Claims, 33 Drawing Sheets

ELECTRONIC APPARATUS AND MANUFACTURING METHOD

CROSS-REFERENCE TO RELATED APPLICATION

This application is based upon and claims the benefit of priority of the prior Japanese Patent Application No. 2011-217449, filed on Sep. 30, 2011, the entire contents of which are incorporated herein by reference.

FIELD

The embodiments discussed herein are related to an electronic apparatus such as a personal computer that has a vibrating component such as hard disk drive (HDD) unit and to a method of manufacturing the electronic apparatus.

BACKGROUND

Electronic apparatuses that have a vibrating component such as an HDD unit include personal computers (PCs). PCs with an integrated liquid crystal display (LCD) are widely used as this type of PCs. Briefly, this type of PC has a front cover, an LCD unit, a chassis, a shielding member, a hinge, and a stand. The LCD unit is an information display unit. The chassis is disposed behind the LCD unit; a circuit board, the HDD unit, and other units are mounted on the chassis. The shielding member shields the circuit board and units. The hinge, which links the main body of the PC and the stand together, tilts the main body of the PC and has other functions. The stand is attached to the hinge to support the main body of the PC. When the HDD unit and other vibrating components are attached to this type of PC, rubber bushings, gaskets, or another vibration absorbing members are used.

As for HDD unit attachment, Japanese Laid-open Patent Publication No. 06-44761 describes a structure in which an HDD unit is secured within a substantially Ω-shaped fixture in a suspended state; the fixture has springs formed by, for example, cutting and bending. In Japanese Laid-open Patent Publication No. 11-86519, an HDD unit is protected from external pressure by the combined use of vibration isolators to suspend the HDD unit.

The HDD unit in an electronic apparatus such as a PC is a vibrating component that generates rotational vibration when it is rotated at high speed. When this vibrating component is secured to a chassis, the chassis may cause resonance due to the rotational vibration and may generate harsh sounds, depending on the method of securing the vibrating component. To suppress this type of vibration and undesired sound, rubber bushings and gaskets have been used.

The rubber bushing and gasket are different from metal parts such as the chassis and are separated from the housing structure, increasing the number of parts and man-hours in attachment. The rubber bushing and gasket receive stress as buffering members in transit and is deteriorated over many years of use, so they may be removed during maintenance, resulting in insufficient reliability. In addition, the worker considers positions at which the rubber bushing and gasket are attached; another task is generated in a bonding task in which a peeling tape is used. Another problem is that when the original elasticity of the rubber bushing or gasket at the time of attachment is reduced due to aging, it is difficult to suppress vibration in a stable manner.

There is a structure in which a gasket is placed between a member on the vibrating side and a member on the chassis side to make a contact between the members stable. In this structure, however, a clearance in which the gasket is placed changes depending on the height of a drawn metal material or the bend or warp of a metal material. Accordingly, even if a gasket is interposed, the function of absorbing vibration may be impaired and thereby vibration sounds may be generated. In the structure in which a gasket is interposed, a small area, of a joint part, with which the gasket is brought into contact is also problematic because a securing force is small and vibration is not adequately suppressed.

SUMMARY

According to an aspect of the invention, an electronic apparatus includes a main body, a hinge through which the main body is attached to a stand, a chassis including a support portion that is attached to the hinge, a vibrating component to which a bracket is attached, the vibrating component being attached to the support portion through the bracket, and a shielding member that is attached to the chassis to cover the chassis without coming into contact with the vibrating component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
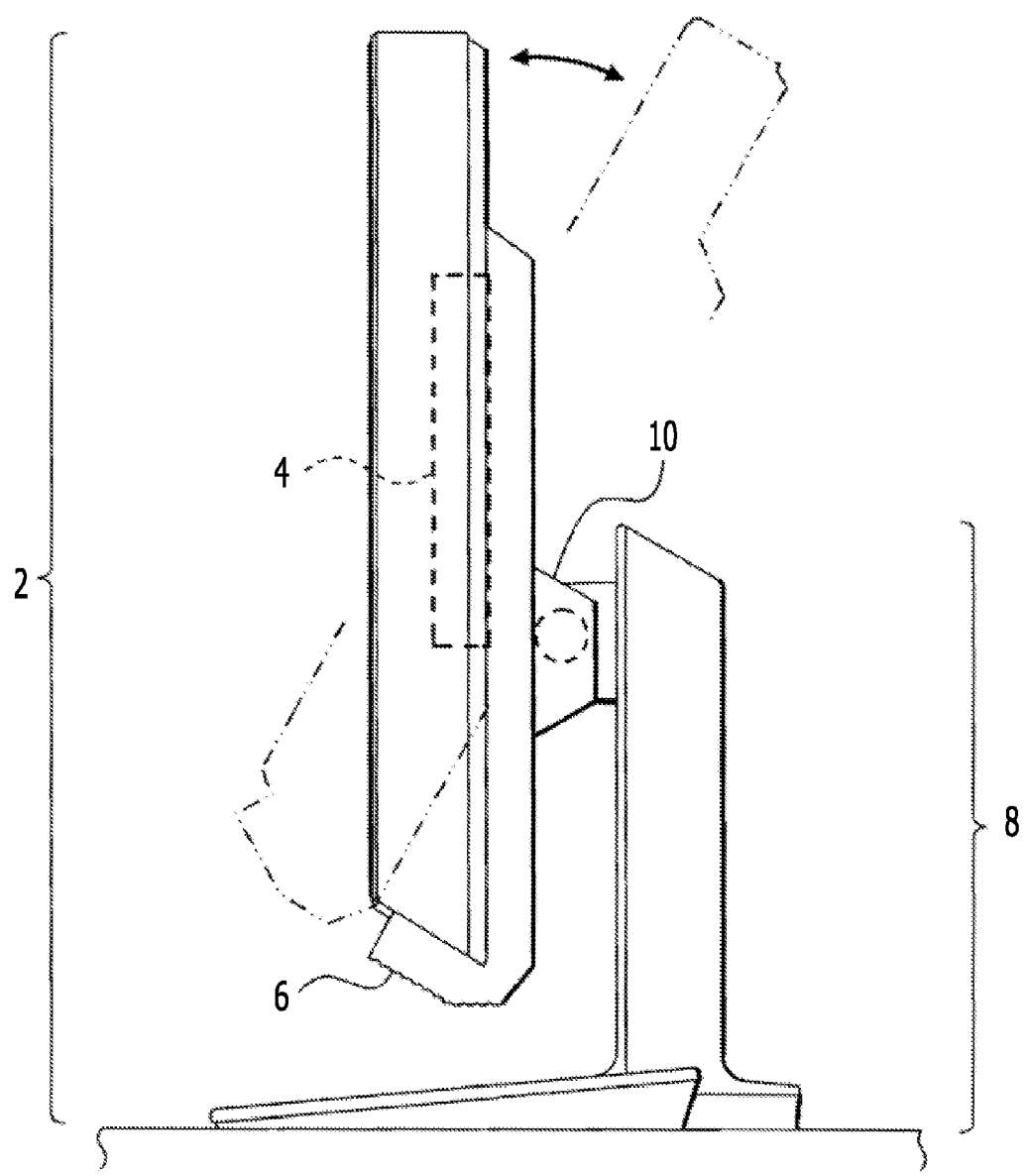
FIG. 1 is a side view of a personal computer in a first embodiment.
Figure 2:
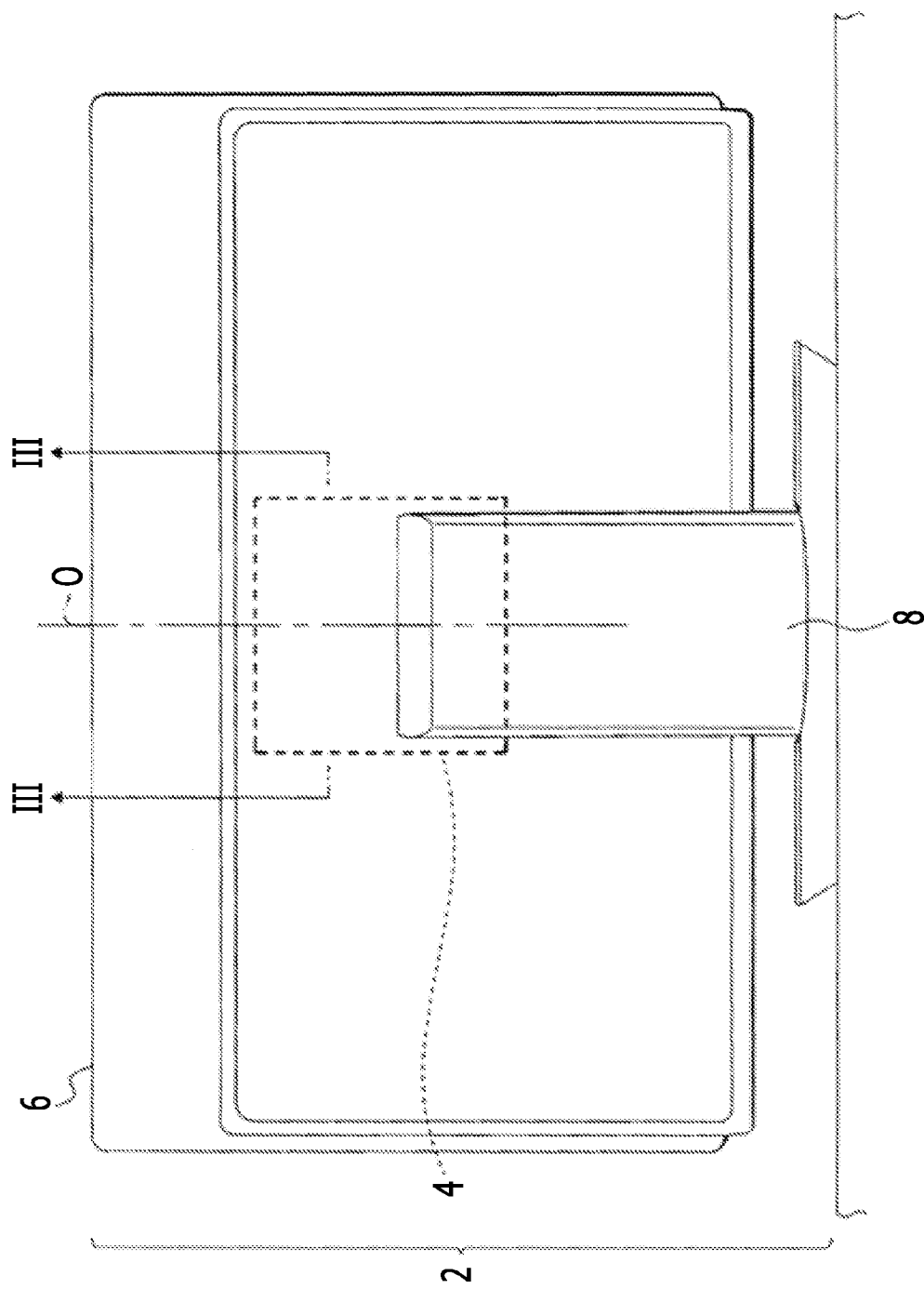
FIG. 2 is a rear view of the personal computer.

FIG. 1 illustrates a personal computer (PC) in a first embodiment. FIG. 2 is a rear view of the PC. The structure illustrated in FIGS. 1 and 2 is an example, and the electronic apparatus in this disclosure and the method of manufacturing it are not limited to this structure.

The PC 2 illustrated in FIGS. 1 and 2, which is an example in this disclosure, has a hard disk drive (HDD) unit 4 as an example of a vibrating component. The HDD unit 4 has a rotating mechanism that rotates at high speed, the rotation of which causes vibration. However, the vibrating component is not limited to HDD unit 4.

A stand 8 is attached to the rear surface of a main body 6 of the PC 2 through a hinge 10. The stand 8 is placed on a horizontal surface, such as, for example, an installation table or a floor surface. The main body 6 is turned through the hinge 10 with respect to the stand 8, enabling the vertical orientation of the main body 6 to be changed.

The HDD unit 4 is placed on the central line O of the main body 6. In this embodiment, the HDD unit 4 is placed so that it becomes bilaterally symmetrical or substantially bilaterally symmetrical with respect to the central line O of the main body 6. The HDD unit 4 is placed at the center of gravity of the main body 6 and is supported by the stand 8 at the center of gravity of the main body 6.

Figure 3:
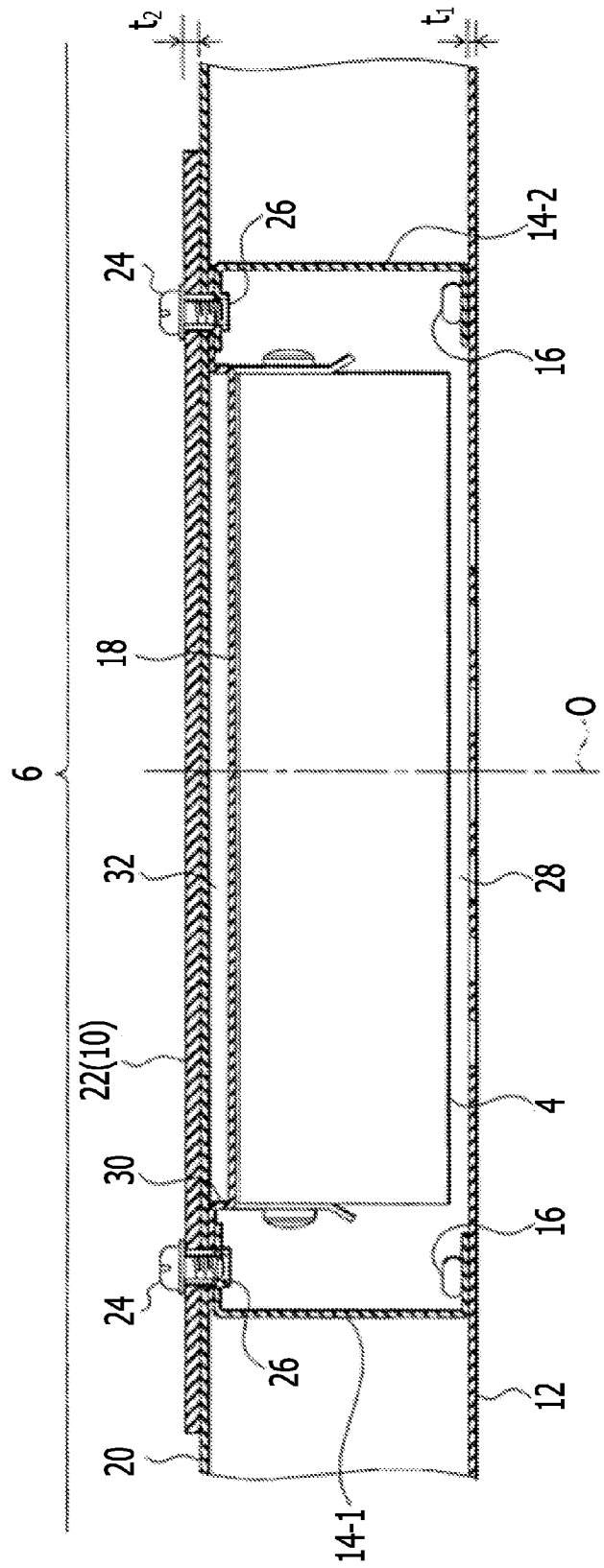
FIG. 3 is a cross sectional view taken along line III-III in FIG. 2.

FIG. 3 is a cross sectional view of the main body 6, which is taken along line III-III in FIG. 2. The main body 6 incorporates a chassis 12. The chassis 12 has a pair of support walls 14-1 and 14-2. The support walls 14-1 and 14-2 are an example of the supporting part of the HDD unit 4. The support walls 14-1 and 14-2 are erected orthogonally to the plane of the chassis 12 and are secured to the chassis 12 with rivets 16, which are an example. A bracket 18 is attached to the HDD unit 4, which is supported by the support walls 14-1 and 14-2, so as to protrude from the sides of the HDD unit 4.

The bracket 18 attached to the HDD unit 4 is placed on the support walls 14-1 and 14-2. A shielding frame 20 is further placed on the bracket 18. The shielding frame 20 is an example of a shielding member that covers the chassis 12 and HDD unit 4. A hinge frame 22, which is part of the hinge 10, is placed on the rear surface of the shielding frame 20. That is, the bracket 18 and shielding frame 20 are interposed between the hinge frame 22 and the pair of support walls 14-1 and 14-2.

Screws 24 are used as an example of securing components that secure the bracket 18, shielding frame 20, and hinge frame 22 simultaneously to the support walls 14-1 and 14-2. The screws 24 are inserted from the hinge frame 22 and are screwed into threaded holes 26 formed in the support walls 14-1 and 14-2. Thus, the bracket 18, shielding frame 20, and hinge frame 22 are secured simultaneously to the support walls 14-1 and 14-2 with the screws 24.

If the thickness of the material of the chassis 12 and shielding frame 20 is denoted $t_1$ and the thickness of the hinge frame 22 is denoted $t_2$, then $t_2$ is larger than $t_1$; $t_2$ has been set so that it is larger than $t_1$ multiplied by 2, for example. The hinge frame 22 with this thickness is attached across the central line O. Thus, the shielding frame 20, chassis 12, support walls 14-1 and 14-2, and other frame members are reinforced.

Figure 4:
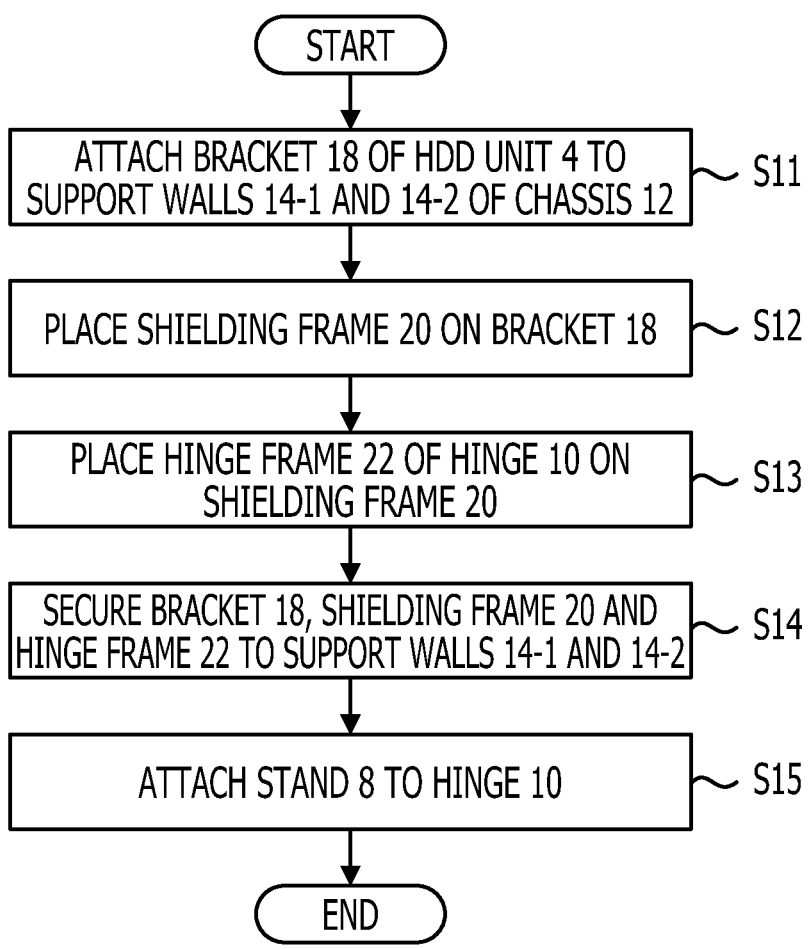
FIG. 4 is a flowchart illustrating an assembling procedure in the first embodiment.

FIG. 4 illustrates an example of a procedure for assembling the PC 2. This assembling procedure is an example of a method of manufacturing the electronic apparatus in this disclosure, and the method of manufacturing the electronic apparatus in this disclosure is not limited to the assembling procedure.

In this assembling procedure, the bracket 18 attached to the HDD unit 4 is attached to the support walls 14-1 and 14-2, which have been secured to the chassis 12 with the rivets 16 (S11). The bracket 18 is assumed to have been secured to the HDD unit 4 in advance.

The shielding frame 20 is placed on the bracket 18 attached to the HDD unit 4, which has been placed on the support walls 14-1 and 14-2 (S12).

The hinge frame 22 of the hinge 10 is placed on the shielding frame 20 (S13), and the screws 24 are secured to the support walls 14-1 and 14-2 from the rear panel of the hinge frame 22 (S14). Thus, the bracket 18, shielding frame 20, and hinge frame 22 are secured simultaneously to the support walls 14-1 and 14-2 with the screws 24.

The stand 8 is attached to the hinge 10 (S15). This completes the assembling of the PC 2.

In this structure, the HDD unit 4, which is a vibrating component, is secured to the hinge frame 22 of the hinge 10 together with the chassis 12, and the HDD unit 4 is supported by the stand 8 through the hinge 10.

The HDD unit 4 is secured to the support walls 14-1 and 14-2, shielding frame 20, and hinge frame 22 through the bracket 18. That is, the HDD unit 4 is supported by the stand 8 with the cantilever structure of the bracket 18.

The HDD unit 4 is supported by the support walls 14-1 and 14-2 and hinge frame 22 through the bracket 18, and the securing portion is limited to the bracket 18. That is, a space 28 is formed between the HDD unit 4 and the support wall 14-1, between the HDD unit 4 and the support wall 14-2, and between the HDD unit 4 and the chassis 12. On the same side as the bracket 18, another space 32 is formed between the HDD unit 4 and the shielding frame 20 due to steps formed by bent portions 30 of the bracket 18. That is, the spaces 28 and 32 separate the HDD unit 4 from the chassis 12, support walls 14-1 and 14-2, and shielding frame 20. Air layers in the spaces 28 and 32 each function as a load in transmission of the vibration caused by the HDD unit 4. In addition, since the HDD unit 4 is secured only by partial metal-to-metal bonding by means of the bracket 18, the transmission of the vibration caused by the HDD unit 4 is restricted and resonance of the chassis 12 and shielding frame 20 is suppressed by the cantilever structure of the bracket 18 and the air layers of the spaces 28 and 32.

The structure described above suppresses harsh sounds generated by the vibration or resonance of the HDD unit 4 without the conventional gaskets and rubber bushing being used. In addition, the bracket 18, shielding frame 20, and hinge frame 22 are secured simultaneously with the screws 24, so the number of parts and man-hours in assembling are reduced.

Second Embodiment

Figure 5:
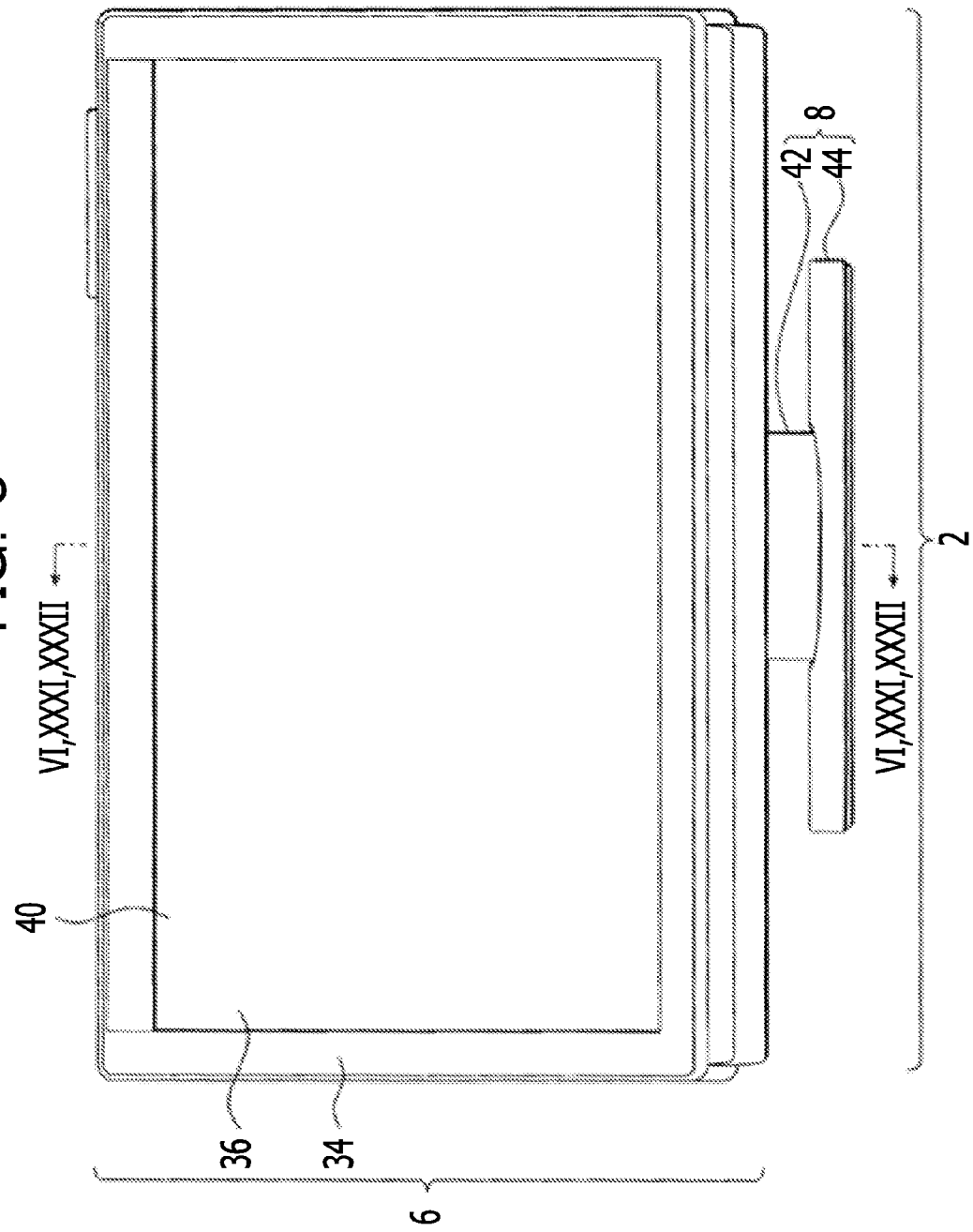
FIG. 5 is a front view of a personal computer in a second embodiment.

FIG. 5 illustrates an example of a personal computer (PC) 2 in a second embodiment. The structure illustrated in FIG. 5 is an example, and the electronic apparatus in this disclosure and the method of manufacturing it are not limited to this structure.

The PC 2 illustrated in FIG. 5 is an example of the electronic apparatus in this disclosure. A front cover 34 provided on the front surface of the main body 6 of the PC 2 covers the outer edge of the main body 6. The front cover 34 has a screen display window 36, in which a display screen 40 of a liquid crystal display (LCD) unit 38 (see FIG. 6) is placed.

The stand 8 is attached to the rear surface of the PC 2. The stand 8 has a post 42 and a pedestal 44. The pedestal 44 is placed on the installation table or floor surface described above.

Internal Structure of the Main Body 6

Figure 6:
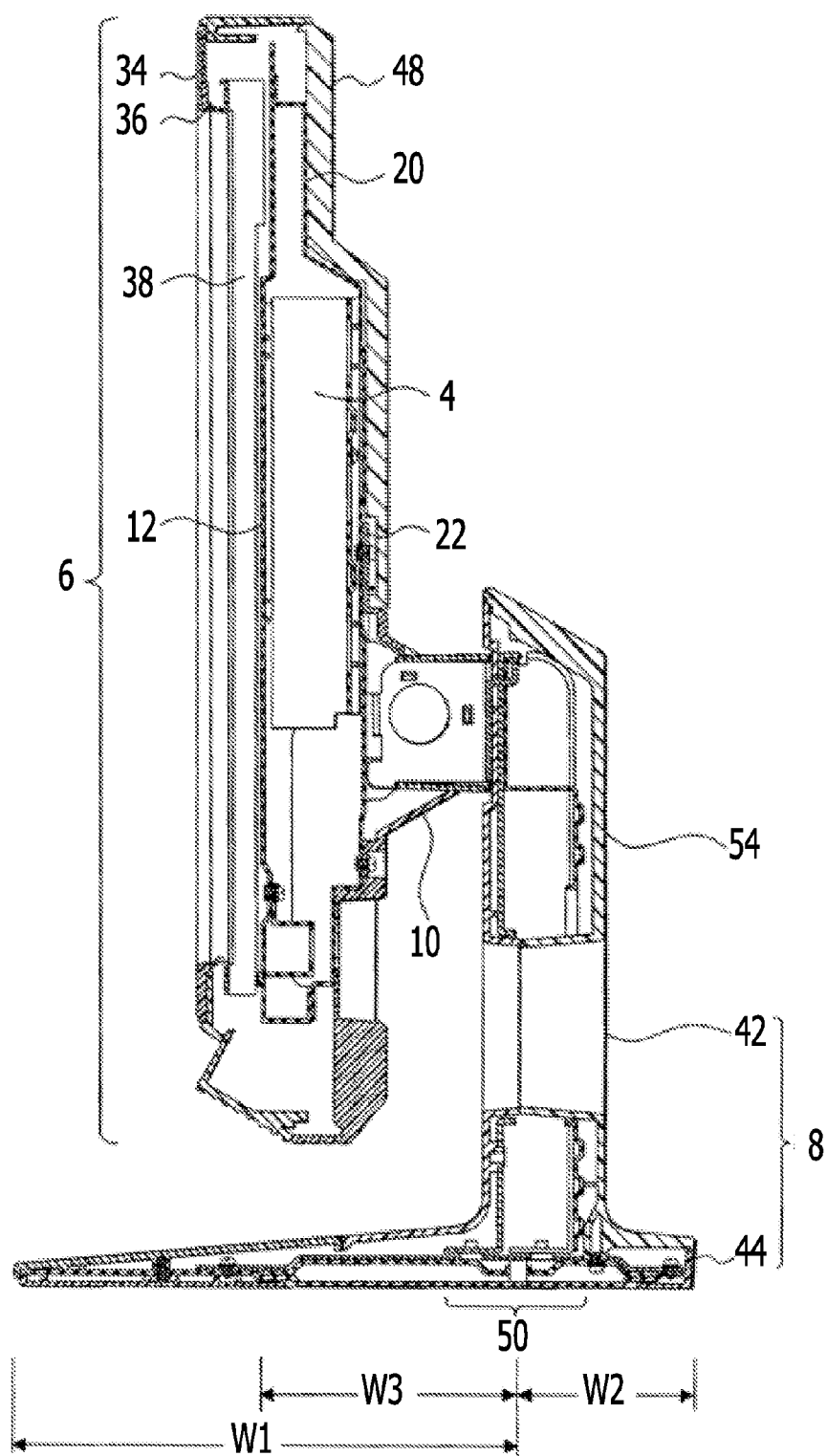
FIG. 6 is a cross sectional view taken along line VI-VI in FIG. 5.

FIG. 6 is a cross sectional view taken along line VI-VI in FIG. 5. The main body 6 incorporates the chassis 12. The LCD unit 38 is attached to the front surface of the chassis 12. The LCD unit 38 is placed between the chassis 12 and the front cover 34. The HDD unit 4 is placed on the same side as the rear surface of the chassis 12. The shielding frame 20 is placed on the same side as the rear surface of the HDD unit 4. The HDD unit 4 and part of the chassis 12 are covered with the shielding frame 20. The chassis 12 and shielding frame 20 are formed by, for example, processing a metal sheet having conductivity. The shielding frame 20, which is an example of a shielding member, has a shielding function.

The hinge 10 includes the hinge frame 22, which is shaped like a plate. The hinge frame 22 is disposed on the rear surface of the shielding frame 20 and is secured to the chassis 12. The hinge frame 22 not only secures the hinge 10 but also reinforces the chassis 12 and shielding frame 20.

The post 42 of the stand 8 is attached to the hinge 10. A rear cover 48 is attached on the rear surface of the main body 6. The rear cover 48 covers the rear surfaces of the shielding frame 20 and hinge frame 22.

The main body 6 of the PC 2 is swingably supported to the post 42 of the stand 8 by the hinge 10. A rotating mechanism 50 is provided between the post 42 and the pedestal 44. The main body 6 can be vertically swung by the hinge 10 as described above, and can also be horizontally swung horizontally together with the post 42 by the rotating mechanism 50.

If a width by which the pedestal 44 of the stand 8 extends forward from the central position of the post 42 is denoted W1 and a width by which the pedestal 44 extends backward from the central position of the post 42 is denoted W2, then W1 is larger than W2; W1 has been set so that it is equal to W2 multiplied by n, n being a positive integer. If the distance between the central position of the post 42 and the central position of the chassis 12, which is vertically kept, is denoted W3, then W3 has been set so that it is nearly equal to half of W1. W3 has also been set so that it is larger than W2. The HDD unit 4 is supported to the post 42 with a cantilever structure through the hinge 10, within the distance W3.

Components of the Main Body 6 and Stand 8

Figure 7:
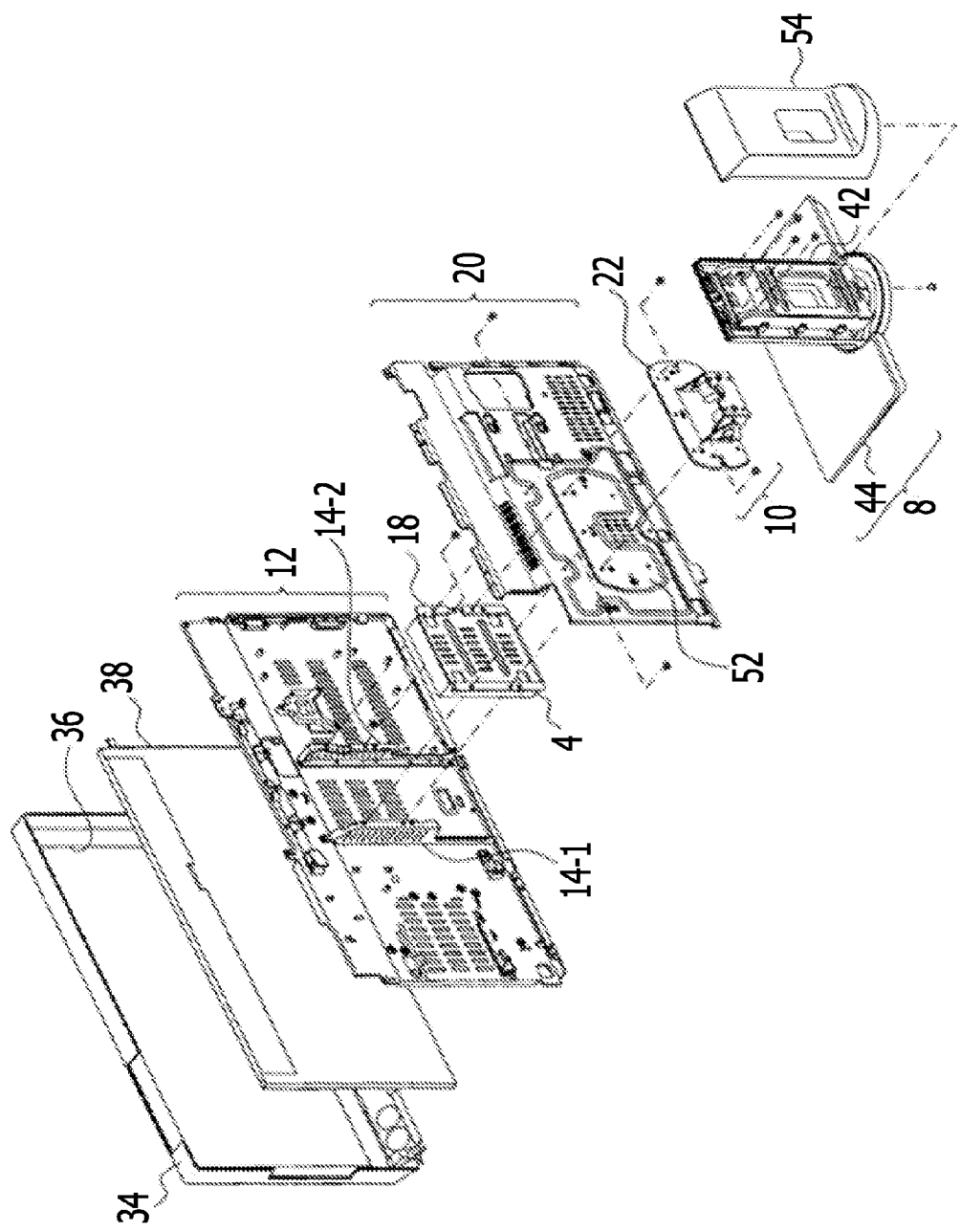
FIG. 7 is an exploded perspective view illustrating a main body and a stand.

FIG. 7 is an exploded perspective view of the main body 6 and stand 8 as viewed from the rear surface. The front cover 34 is disposed on the front side of the main body 6. The LCD unit 38 is interposed between the front cover 34 and the chassis 12. The LCD unit 38 is a rectangular plate-like member. The LCD unit 38 is protected by the front cover 34 and chassis 12 and is reinforced by the chassis 12.

The pair of support walls 14-1 and 14-2 are placed in parallel at the central part of the rear surface of the chassis 12 with a fixed space between them. The HDD unit 4 is attached to the support walls 14-1 and 14-2 through the bracket 18.

The shielding frame 20 is disposed on the rear side of the HDD unit 4. The shielding frame 20 covers the HDD unit 4 and also covers part of the chassis 12.

The hinge frame 22 of the hinge 10 is attached to the rear surface of the shielding frame 20. A mounting area 52, on which the hinge frame 22 will be mounted, is formed on the rear surface of the shielding frame 20.

The post 42 of the stand 8 is attached to the hinge 10. A post rear cover 54 is attached to the rear surface of the post 42.

HDD Unit 4 and Bracket 18

Figure 8:
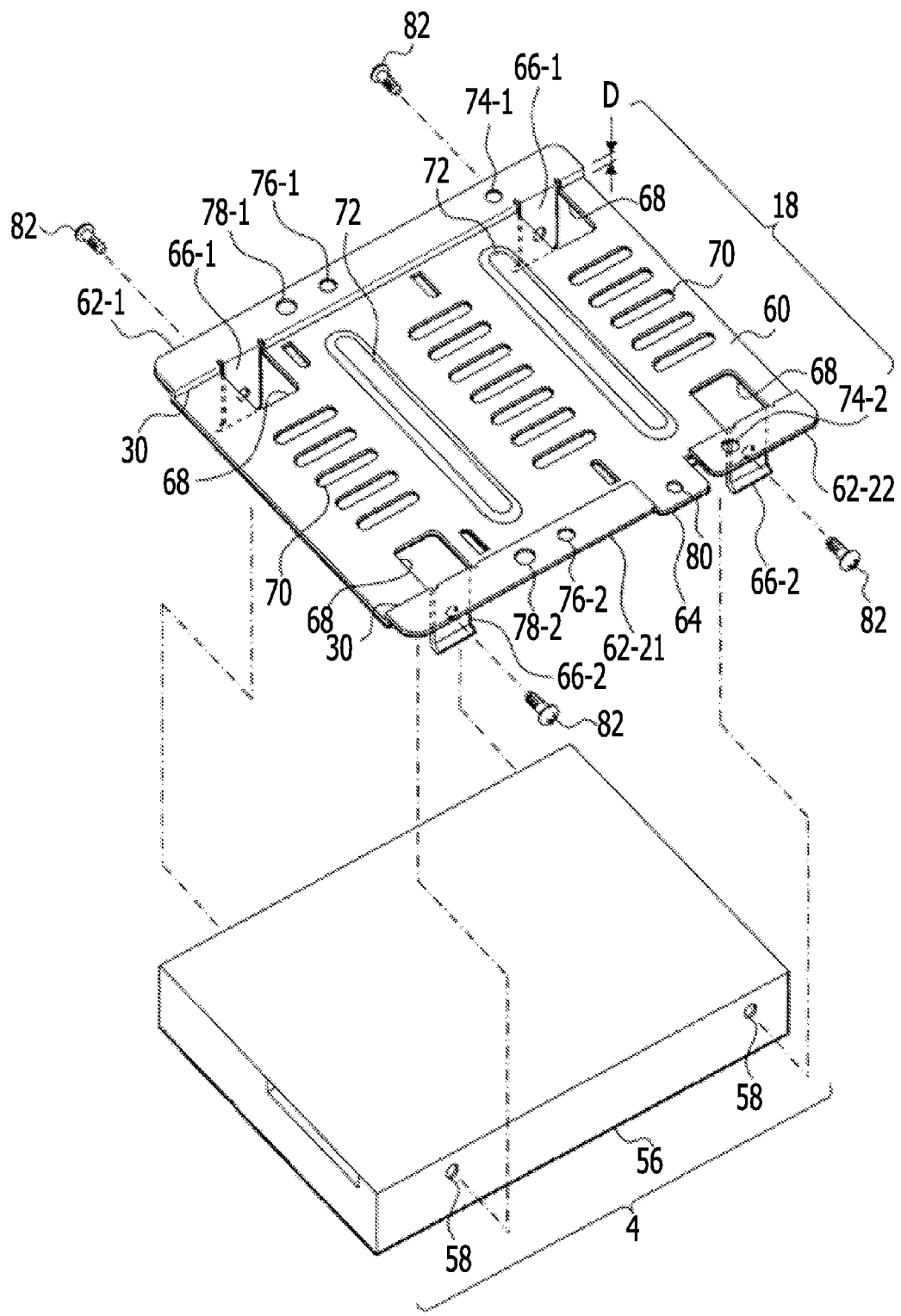
FIG. 8 is a perspective view illustrating an HDD unit and a bracket.
Figure 9:
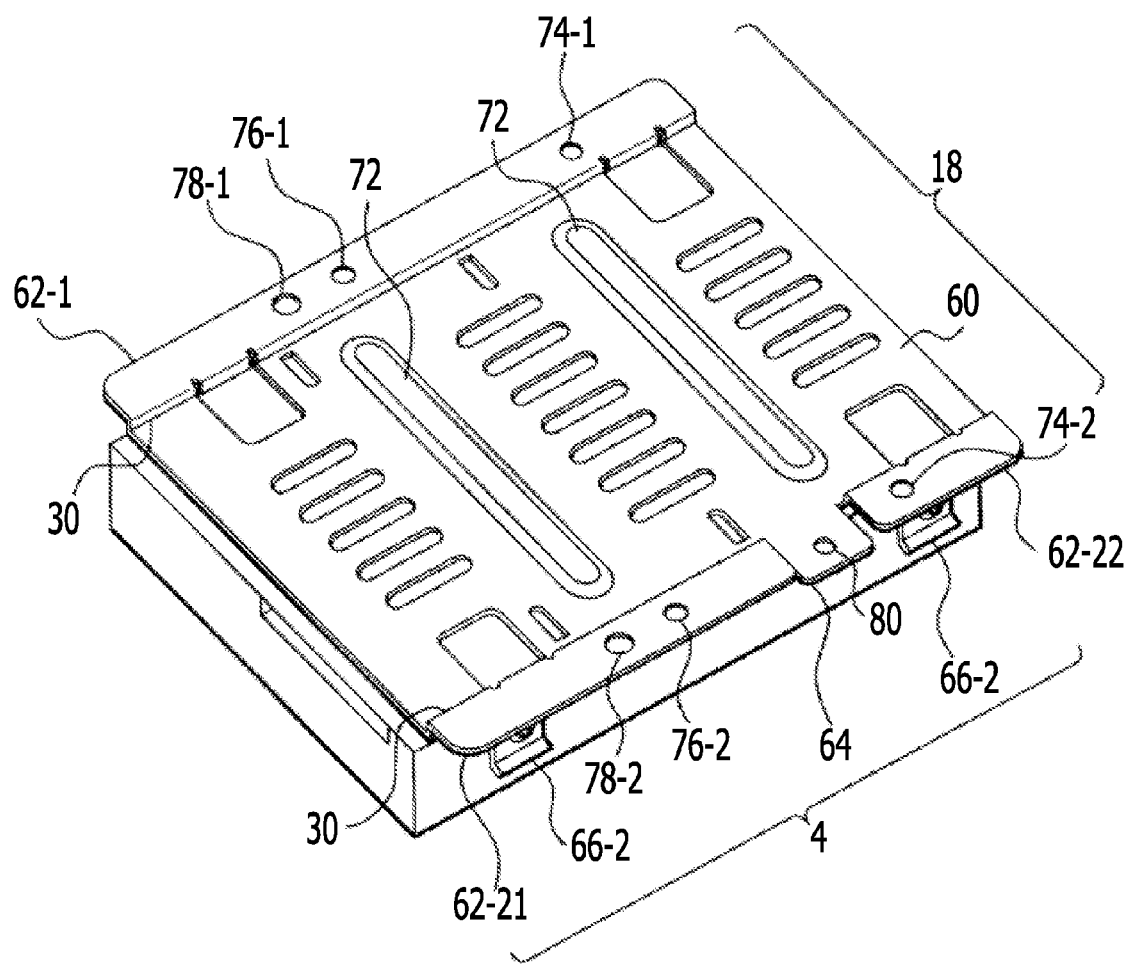
FIG. 9 is a perspective view illustrating the HDD unit to which the bracket has been attached.
Figure 10:
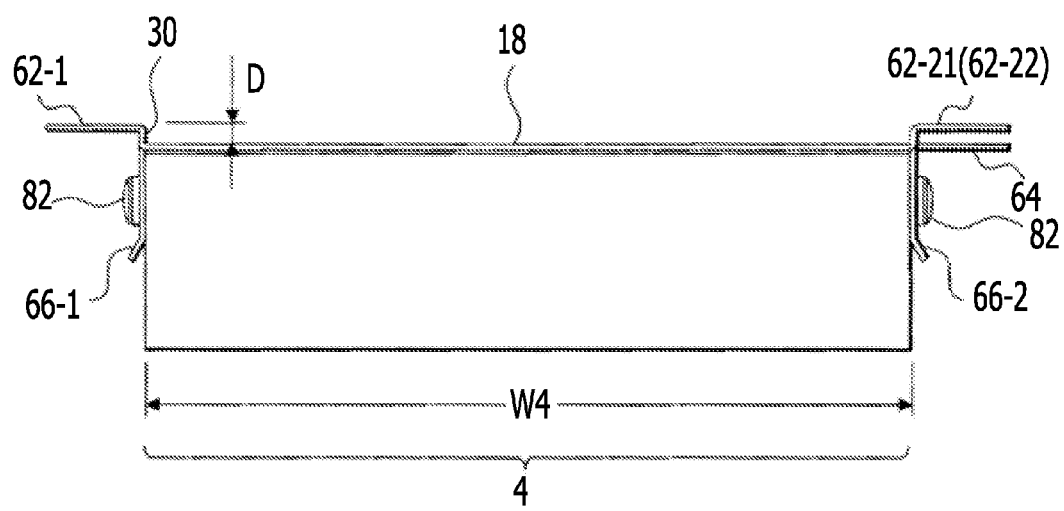
FIG. 10 illustrates a side shape of the bracket to which the HDD unit has been attached.

FIG. 8 illustrates the HDD unit 4 and bracket 18. FIGS. 9 and 10 illustrate the HDD unit 4 to which the bracket 18 has been attached.

The HDD unit 4 has a case 56, which is a flat rectangular parallelepiped. The case 56 is formed with, for example, a synthetic resin. A recording medium and a head are included in the case 56, and a rotating mechanism that rotates the recording medium and other components are also incorporated therein. A plurality of screw holes 58 are formed in side surfaces of the case 56.

The bracket 18, which secures the HDD unit 4 to another member, is formed with a metal plate, as with the chassis 12. The bracket 18 has a rectangular bracket main body 60, which covers the case 56. A first securing tab 62-1 is formed on one longer side of the bracket main body 60, and first securing tabs 62-21 and 62-22 are formed on the other longer side of the bracket main body 60. The first securing tabs 62-1, 62-21, and 62-22 have been bent from the edges of the bracket main body 60 in a direction in which the first securing tabs 62-1, 62-21, and 62-22 are apart from the case 56, and a step D is formed by a bent portion 30 between the bracket main body 60 and each of the first securing tabs 62-1, 62-21, and 62-22.

A tentative securing tab 64 is formed between the first securing tabs 62-21 and 62-22 to tentatively secure the HDD unit 4 before the HDD unit 4 is positioned to the support wall support wall 14-2. The tentative securing tab 64 is flushed with the bracket main body 60. Accordingly, the step D described above is formed between the tentative securing tab 64 and each of the first securing tabs 62-21 and 62-22.

The bracket main body 60 has second securing tabs 66-1 at two positions in the longitudinal direction on the first securing tab 62-1, the second securing tabs 66-1 being in a direction orthogonal to the first securing tab 62-1, and also has second securing tabs 66-2 at two positions in the longitudinal direction on the first securing tabs 62-21 and 62-22, the second securing tabs 66-2 being in a direction orthogonal to the first securing tab 62-21 and 62-22; the second securing tabs 66-1 and 66-2 are formed by lugging; the positions of the second securing tabs 66-1 and 66-2 correspond to the screw holes 58 in the HDD unit 4. The space between each second securing tab 66-1 and its corresponding second securing tab 66-2 matches the width of the HDD unit 4.

The bracket main body 60 has through-holes 68 opened as the result of forming the second securing tabs 66-1 and 66-2, a plurality of slit-like vents 70, and ribs 72 formed for reinforcement.

The first securing tab 62-1 has through-holes 74-1, 76-1, and 78-1. Similarly, the first securing tab 62-21 has through-holes 76-2 and 78-2 and the first securing tab 62-22 has a through-hole 74-2. The tentative securing tab 64 has a through-hole 80.

When screws 82 are inserted into the second securing tabs 66-1 and 66-2 and screwed into the screw holes 58 in the sides of the HDD unit 4, the bracket 18 is secured to the HDD unit 4 (see FIG. 9).

With the HDD unit 4 to which the bracket 18 has been secured, the step D is formed between the tentative securing tab 64 and each of the first securing tabs 62-1, 62-21, and 62-22 due to the bent portion 30 formed on the bracket 18, as illustrated in FIG. 10. This step D forms the space 32 (see FIG. 3) between the shielding frame 20 and the HDD unit 4.

Chassis 12

Figure 11:
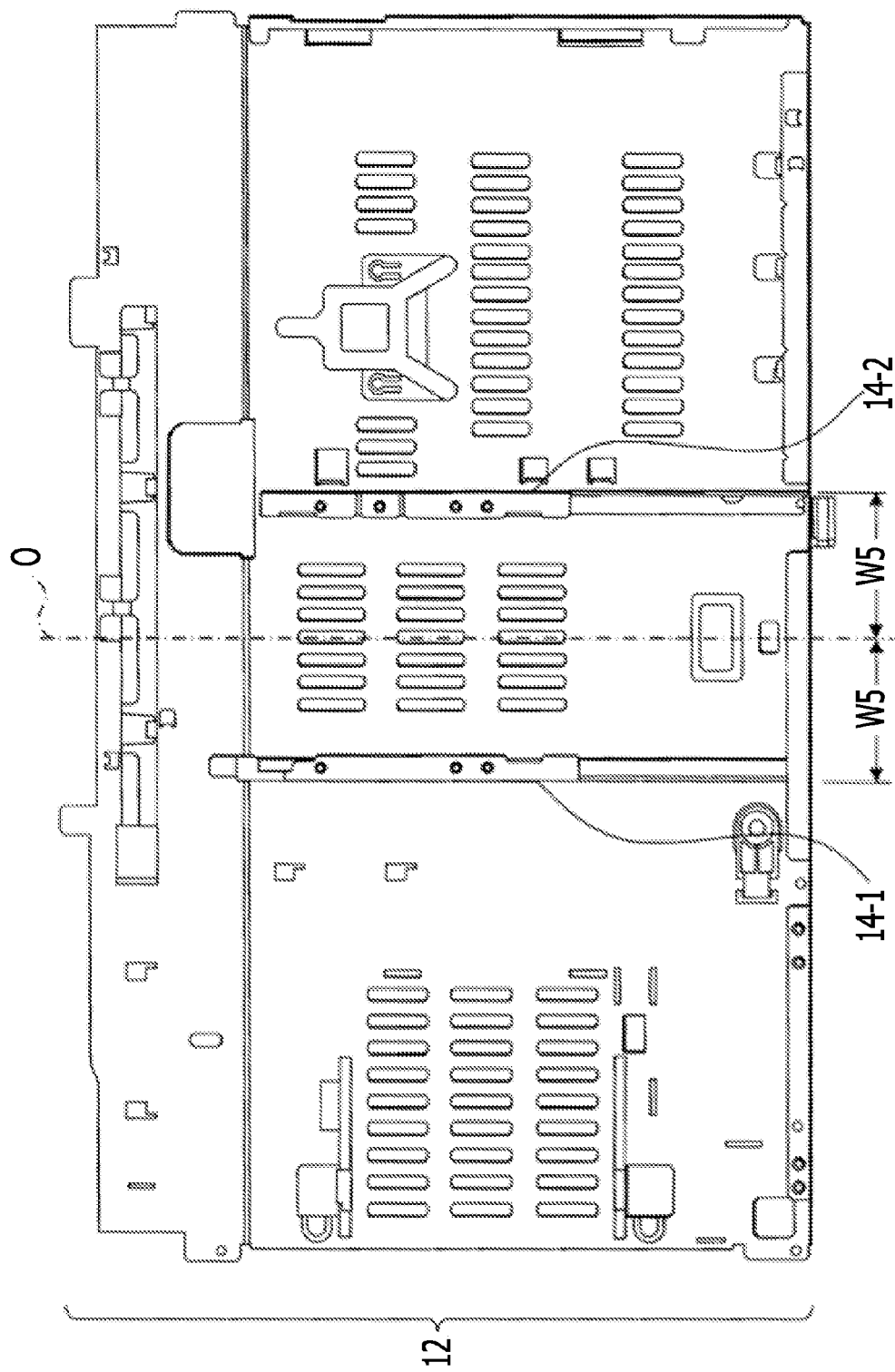
FIG. 11 illustrates the rear surface of a chassis having support walls.
Figure 12:
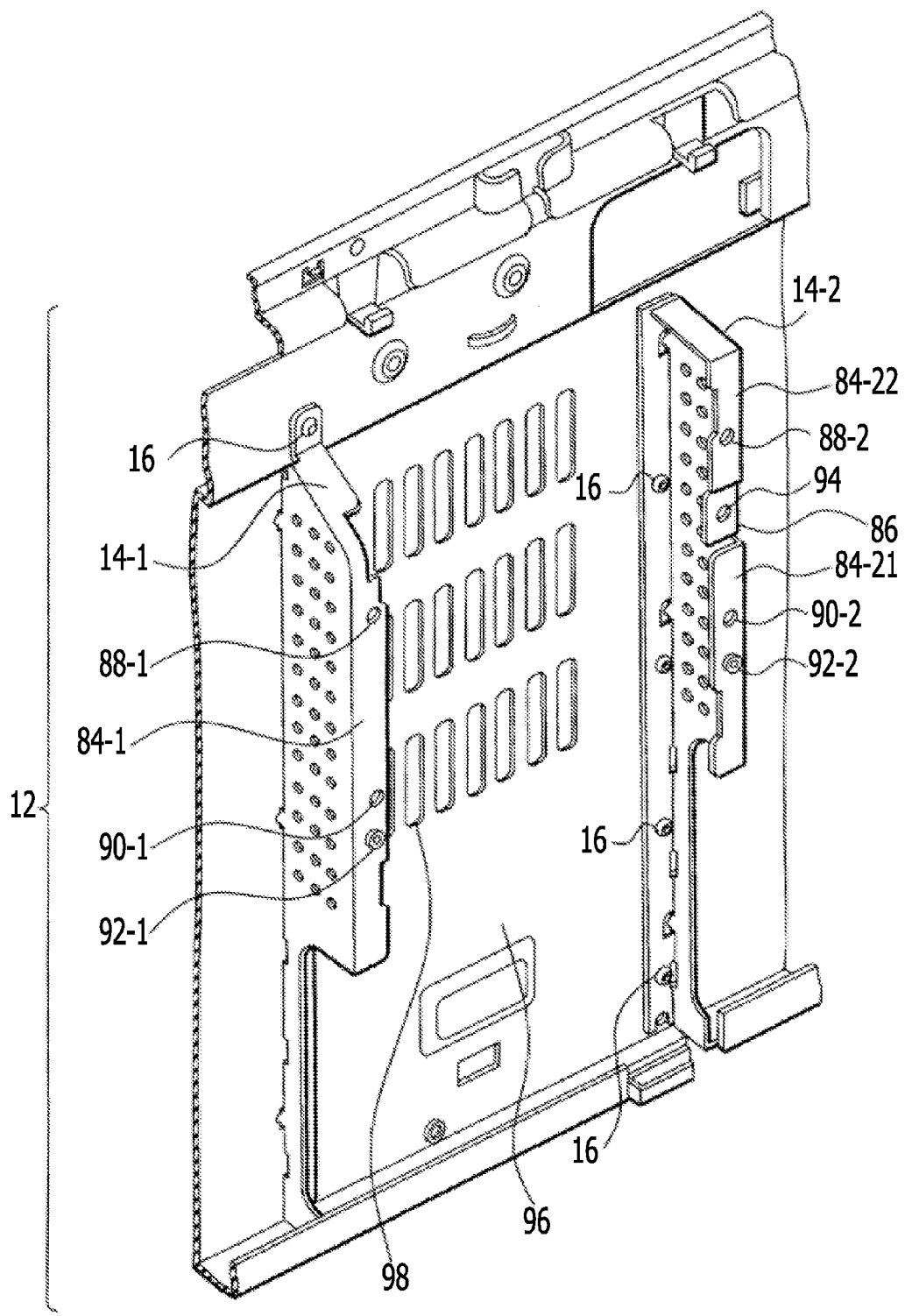
FIG. 12 is a perspective view illustrating part of the chassis having a support wall.

FIG. 11 illustrates the chassis 12, which has the support walls 14-1 and 14-2. FIG. 12 is an enlarged view of the support walls 14-1 and 14-2 and portions at which they are secured. Although, in this embodiment, the chassis 12 and the support walls 14-1 and 14-2 are provided separately from each other, the support walls 14-1 and 14-2 may be formed as part of the chassis 12.

When the central line O described above is taken for the chassis 12, the support walls 14-1 and 14-2 are placed in parallel at equal distances (W5) from the central line O, as illustrated in FIG. 11. Therefore, the distance (2×W5) between the support walls 14-1 and 14-2 is set to a value larger than the width W4 of the HDD unit 4 (see FIG. 10) (2×W5>W4).

The support walls 14-1 and 14-2 are secured to the chassis 12 with the rivets 16. The support wall 14-1 has a securing part 84-1, which secures the first securing tab 62-1 of the bracket 18, at the vertex. The support wall 14-2 has a securing part 84-21, which secures the first securing tabs 62-21, and a securing part 84-22, which secures the first securing tabs 62-22, at the vertex. The support wall 14-2 also has a securing part 86, which secures the tentative securing tab 64. These securing parts 84-1, 84-21, 84-22, and 86 are formed by bending the support walls 14-1 and 14-2 in directions in which the support walls 14-1 and 14-2 face each other so as to be parallel to the chassis 12.

The securing part 84-1 has a screw hole 88-1 corresponding to the through-hole 74-1 formed in the bracket 18, a screw hole 90-1 corresponding to the through-hole 76-1, and a positioning projection 92-1, which is inserted into the through-hole 78-1. The positioning projection 92-1 is a cylindrical projection formed by burring the material of the securing part 84-1. The securing part 84-22 has a screw hole 88-2 corresponding to the through-hole 74-2. The securing part 84-21 has a screw hole 90-2 corresponding to the through-hole 76-2 and a positioning projection 92-2, which is inserted into the through-hole 78-2. The positioning projection 92-2 is formed by burring the material of the securing part 84-21. The securing part 86 has a screw hole 94 corresponding to the through-hole 80.

As described above, the chassis 12 interposed between the support walls 14-1 and 14-2 has a mounting area 96, on which the HDD unit 4 will be mounted. A plurality of slit-like vents 98 are formed in the mounting area 96 of the chassis 12.

Placement of the HDD Unit 4 on the Chassis 12

Figure 13:
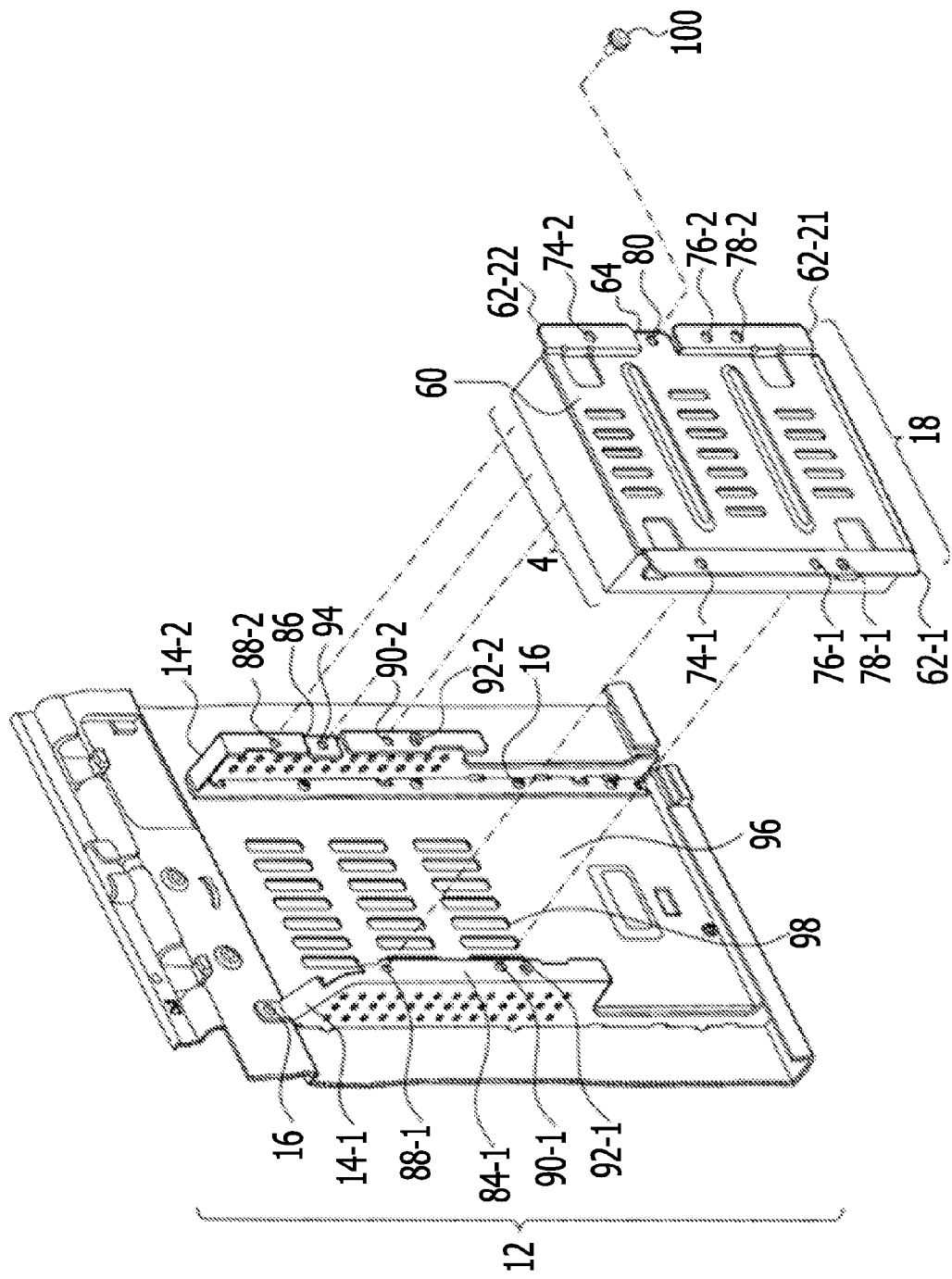
FIG. 13 illustrates the chassis having the support walls and the HDD unit.

FIG. 13 illustrates how the HDD unit 4 is attached to the support walls 14-1 and 14-2. To tentatively secure the HDD unit 4 to the support walls 14-1 and 14-2, the tentative securing tab 64 of the bracket 18 is aligned to the securing part 86, a screw 100 is inserted into the through-hole 80, and the screw 100 is screwed into the screw hole 94 formed in the securing part 86. In this case, when the positioning projection 92-1 is inserted into the through-hole 78-1 and the positioning projection 92-2 is inserted into the through-holes 78-2, the bracket 18 and HDD unit 4 are precisely positioned together to prescribed positions. This positioning enables the through-hole 74-1 to be automatically aligned to the screw hole 88-1, the through-hole 76-1 to be automatically aligned to the 90-1, the through-hole 74-2 to be automatically aligned to the 88-2, and the through-holes 76-2 to be automatically aligned to the 90-2.

Figure 14:
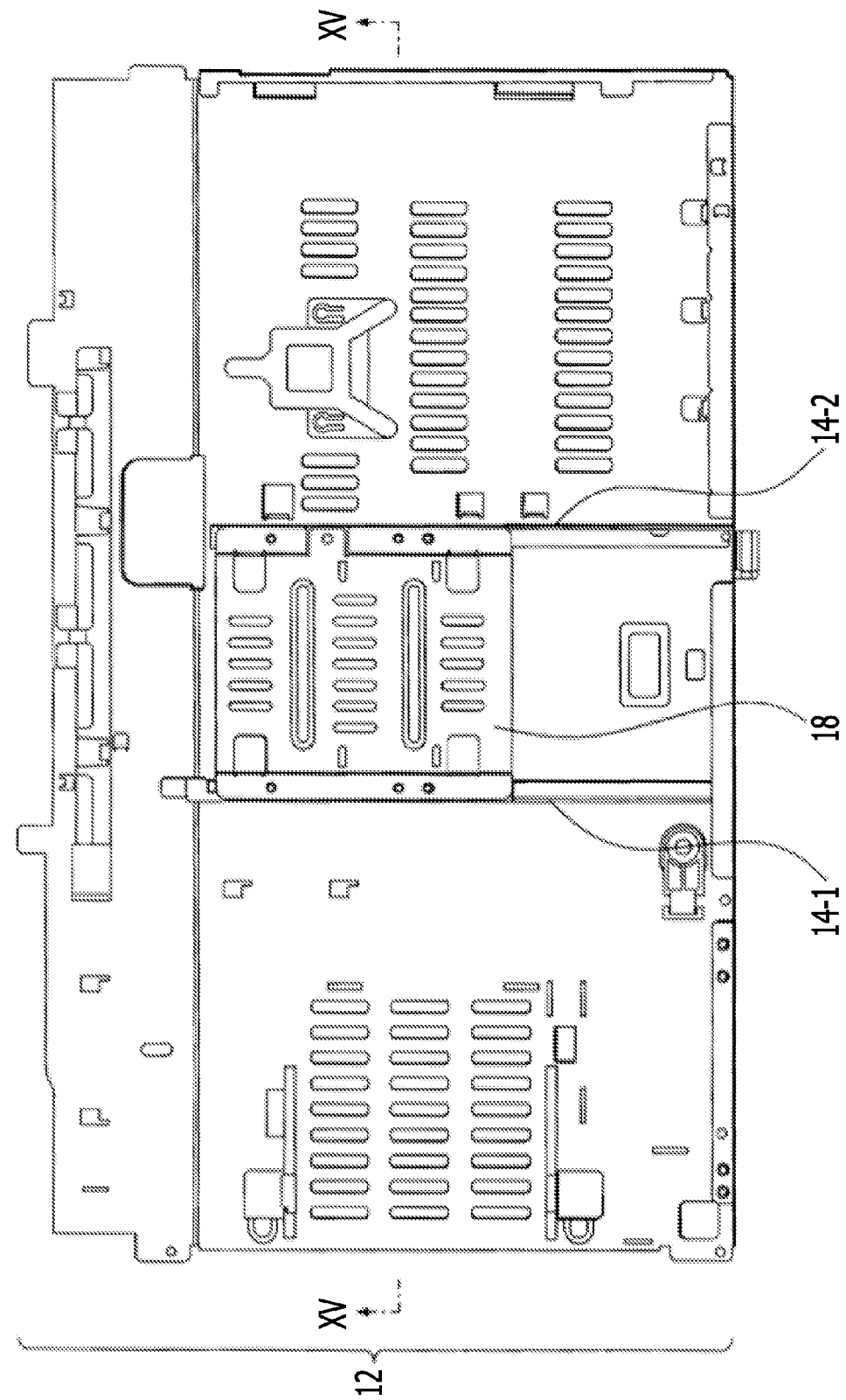
FIG. 14 illustrates the chassis on which the HDD unit is placed.
Figure 15:
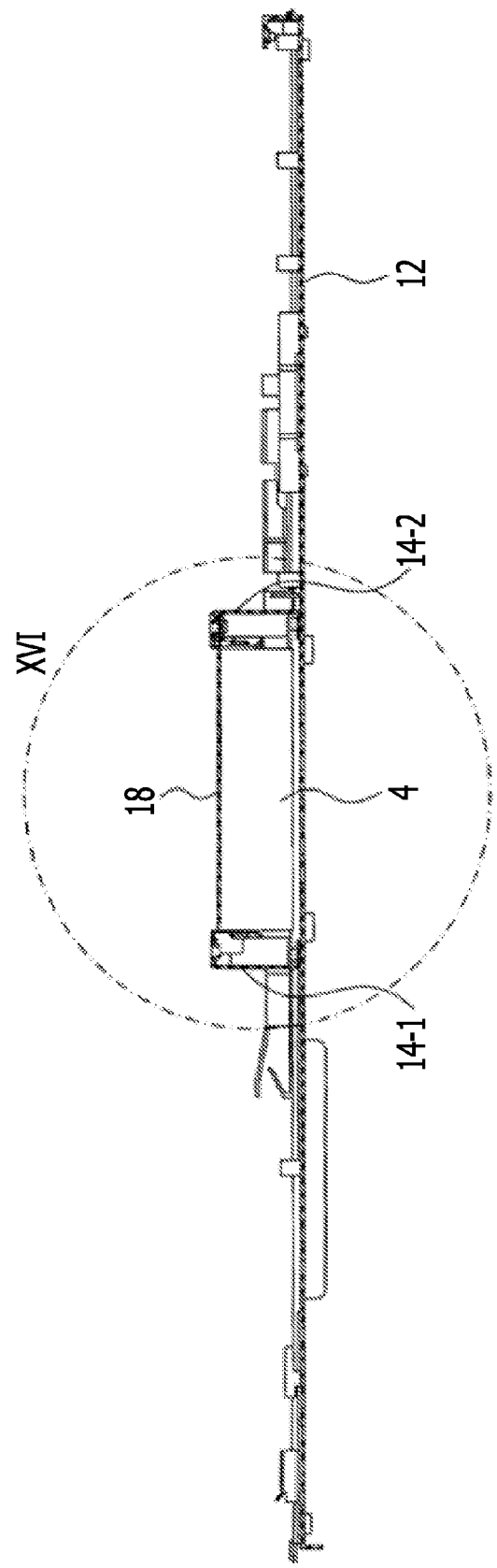
FIG. 15 is a cross sectional view taken along line XV-XV in FIG. 14.
Figure 16:
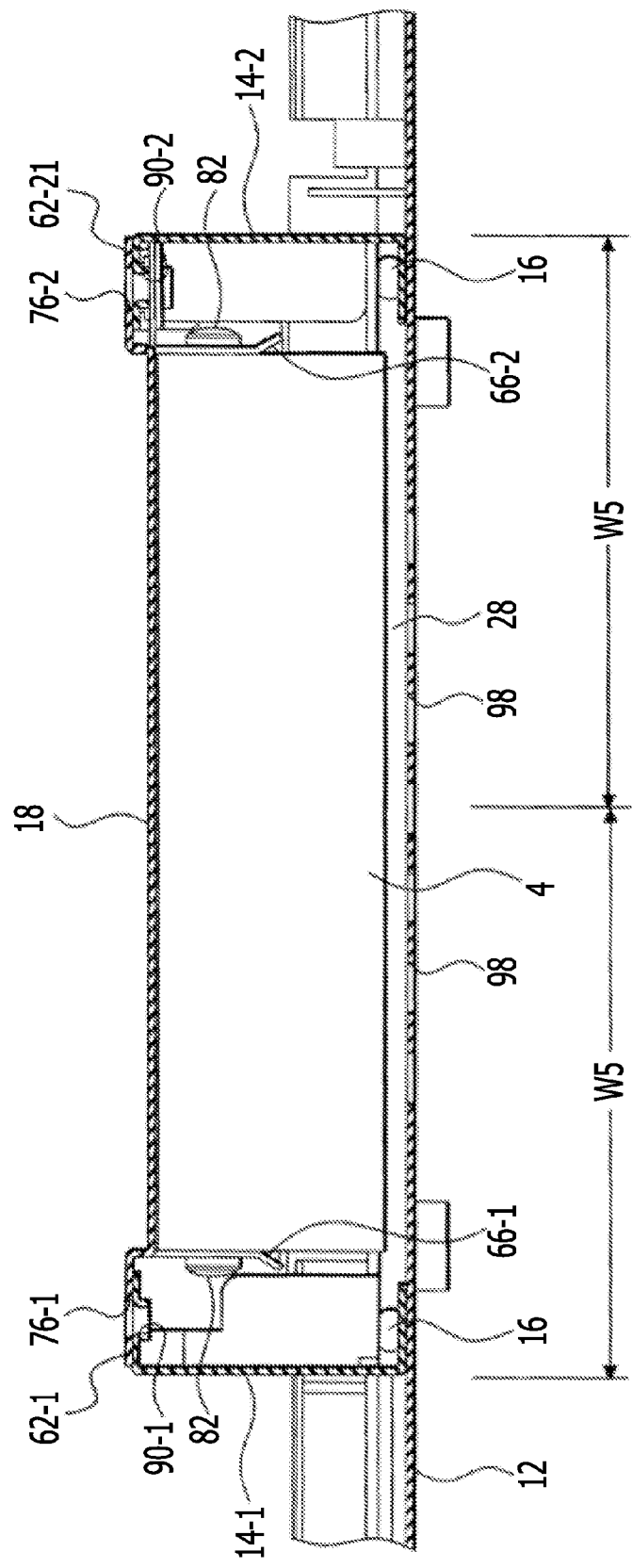
FIG. 16 is an enlarged view of portion XVI in FIG. 15.

Then, the HDD unit 4 is placed on the chassis 12 by being positioned on the support walls 14-1 and 14-2, as illustrated in FIG. 14. FIG. 15 is a cross sectional view taken along line XV-XV in FIG. 14 and FIG. 16 is an enlarged view of portion XVI in FIG. 15. As described above, the HDD unit 4 is tentatively secured to the chassis 12.

Hinge 10 and Shielding Frame 20

Figure 17:
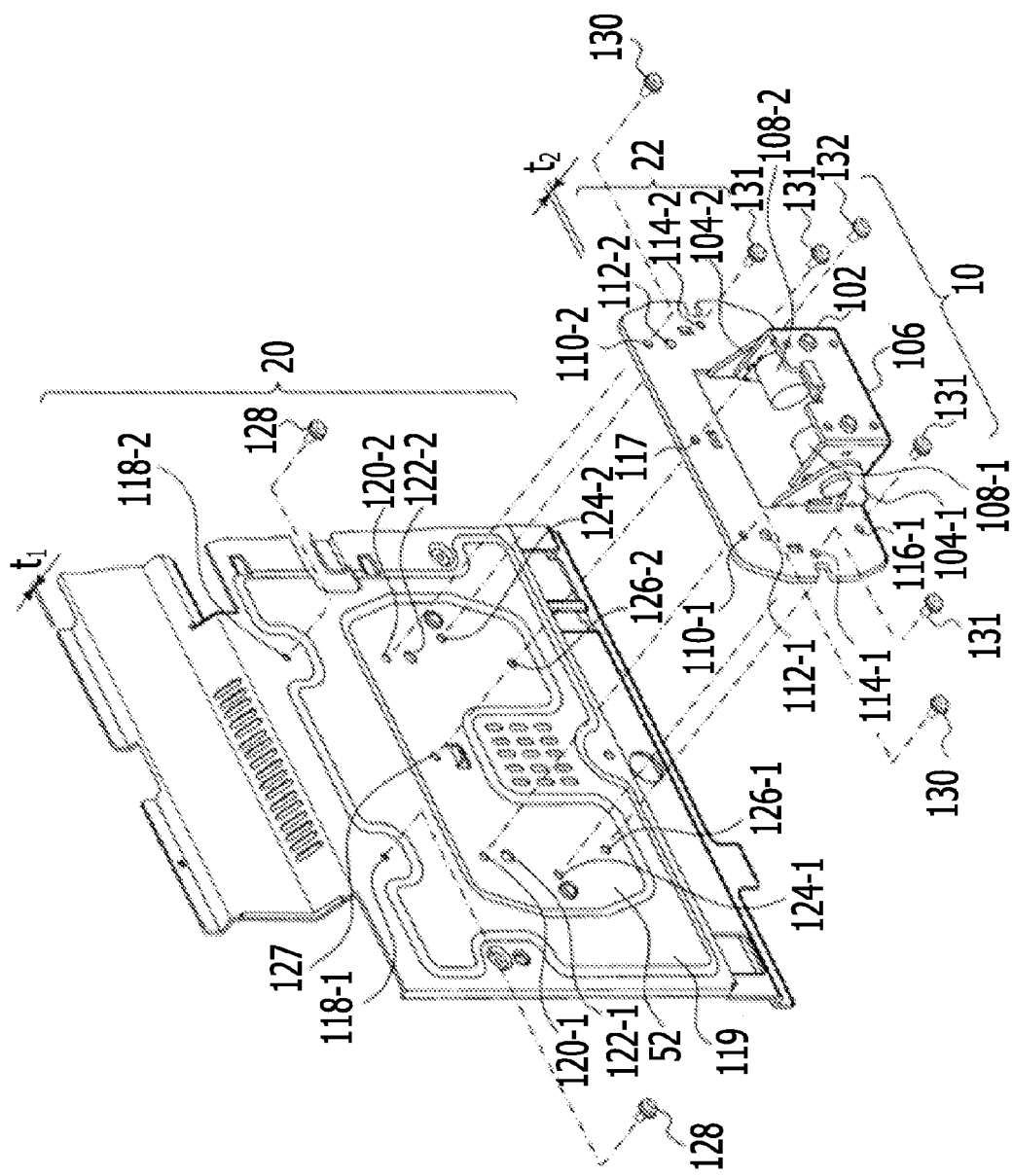
FIG. 17 is a perspective view illustrating a hinge and part of a shielding frame.

FIG. 17 illustrates part of the hinge 10 and shielding frame 20.

The hinge 10 has the hinge frame 22 to be attached to the shielding frame 20 and also has a movable frame 102 to be attached to the post 42 of the stand 8. The hinge frame 22, which is a plate-like member having a larger size than the movable frame 102, has a pair of bearings 104-1 and 104-2, which are formed by being lugged from the plate-like member. The movable frame 102, which is a U-shaped frame attached to the inside of the bearings 104-1 and 104-2, has a securing part 106, through which the movable frame 102 is secured to the post 42 of the stand 8. The movable frame 102 is swingably attached to the bearings 104-1 and 104-2 by support axes 108-1 and 108-2.

If the thickness of the material of the chassis 12 and shielding frame 20 is denoted $t_1$, the hinge frame 22 is formed with the same material as the chassis 12 and shielding frame 20, and the thickness of the hinge frame 22 is denoted $t_2$, then $t_2$ is larger than $t_1$; $t_2$ has been set so that it is larger than $t_1$ multiplied by 2, for example; as an example, $t_1$ is 0.8 mm and $t_2$ is 2 mm. With these thickness settings, when the hinge frame 22 is attached, the shielding frame 20, chassis 12, support walls 14-1 and 14-2, and other frame members are reinforced.

The hinge frame 22 has a through-hole 110-1 corresponding to the screw hole 90-1 formed in the securing part 84-1 of the support wall 14-1, a through-hole 112-1 into which the positioning projection 92-1 is inserted, and a plurality of through-holes 114-1 and 116-1. The hinge frame 22 also has a through-hole 110-2 corresponding to the screw hole 90-2 formed in the securing part 84-21 of the support wall 14-2, a through-hole 112-2 into which the positioning projection 92-2 is inserted, and a plurality of through-holes 114-2 and 116-2. In addition, a through-hole 117 is formed at the center of the hinge frame 22.

The mounting area 52 of the shielding frame 20 is enclosed by a rib 119. The mounting area 52 is reinforced by the rib 119. Outside the rib 119, there are a through-hole 118-1 corresponding to the screw hole 88-1 formed in the securing part 84-1 of the support wall 14-1 and a through-hole 118-2 corresponding to the screw hole 88-2 formed in the securing part 84-22 of the support wall 14-2. The mounting area 52 has a through-hole 120-1 corresponding to the through-hole 110-

1, a through-hole 122-1 corresponding to the through-hole 112-1, a through-hole 124-1 corresponding to the through-hole 114-1, and a through-hole 126-1 corresponding to the through-hole 116-1. The mounting area 52 also has a through-hole 120-2 corresponding to the through-hole 110-2, a through-hole 122-2 corresponding to the through-hole 112-2, a through-hole 124-2 corresponding to the through-hole 114-2, and a through-hole 126-2 corresponding to the through-hole 116-2. The mounting area 52 also has a screw hole 127 corresponding to the through-hole 117.

When the positioning projection 92-1 on the support wall 14-1 is inserted into the through-hole 112-1 and the positioning projection 92-2 on the support wall 14-2 is inserted into the through-hole 112-2, the support walls 14-1 and 14-2 projecting from the shielding frame 20, the correspondences described above enable the hinge frame 22 to be positioned on the shielding frame 20.

The shielding frame 20 is secured to the support walls 14-1 and 14-2 with screws 128. The hinge frame 22 is secured to the support walls 14-1 and 14-2 with a plurality of screws 130 with the shielding frame 20 interposed therebetween and is also secured to the shielding frame 20 with screws 131 and 132.

Figure 18:
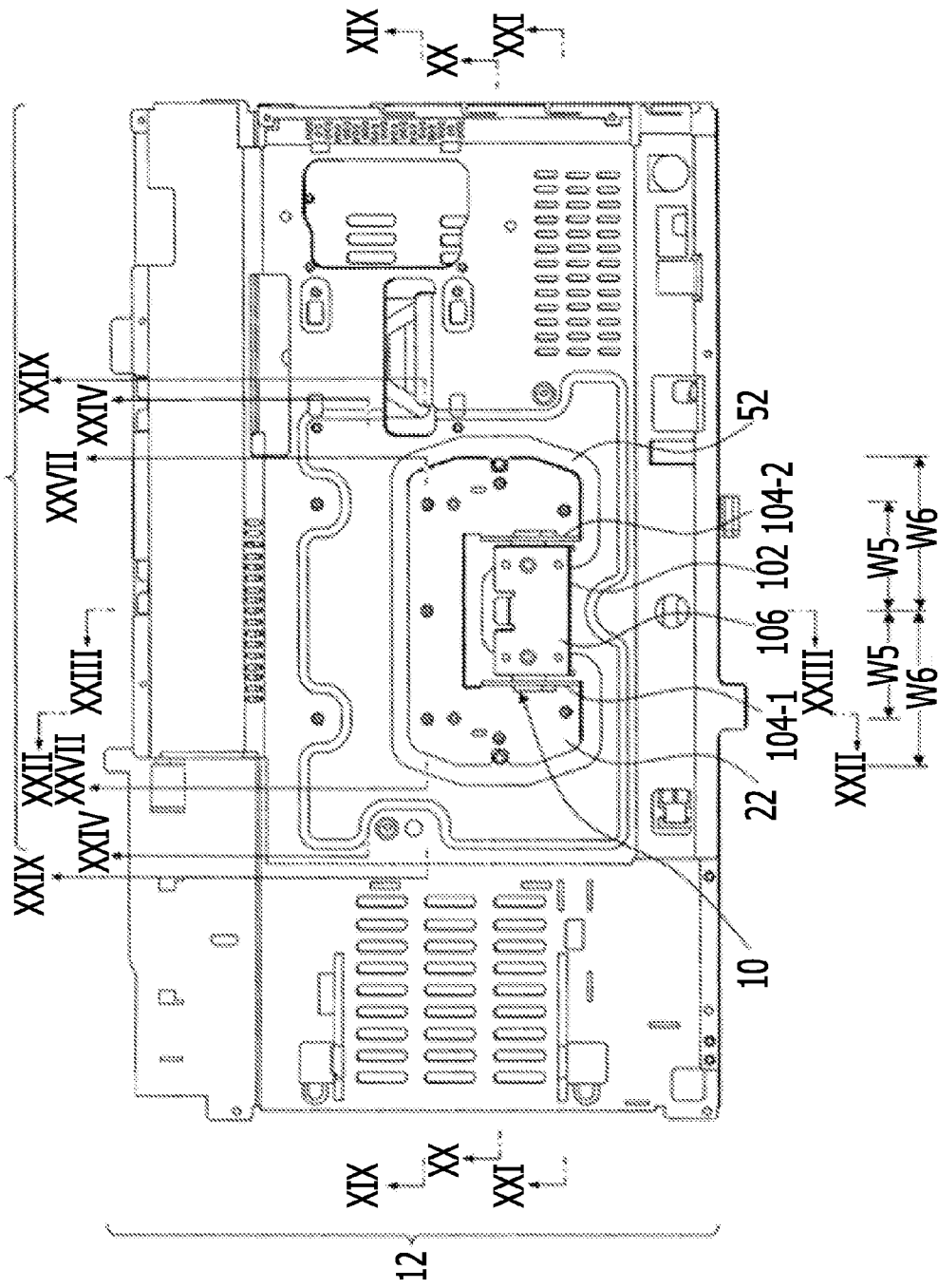
FIG. 18 illustrates the chassis, shielding frame, and hinge.
Figure 19:
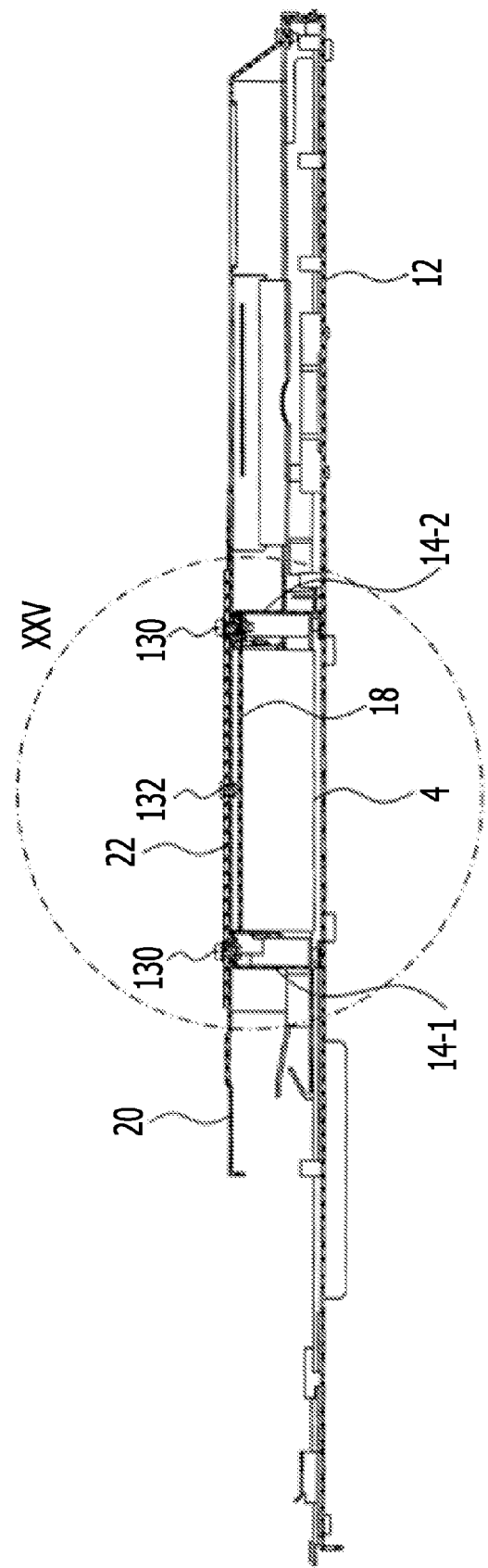
FIG. 19 is a cross sectional view taken along line XIX-XIX in FIG. 18.
Figure 20:
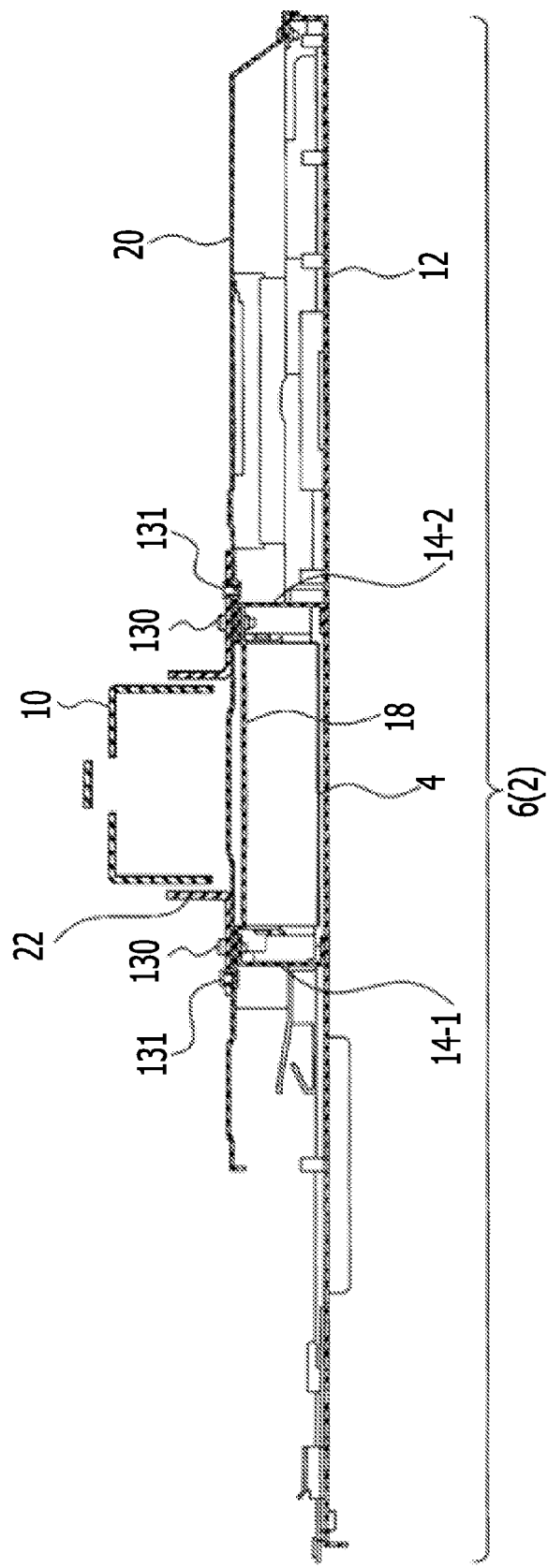
FIG. 20 is a cross sectional view taken along line XX-XX in FIG. 18.
Figure 21:
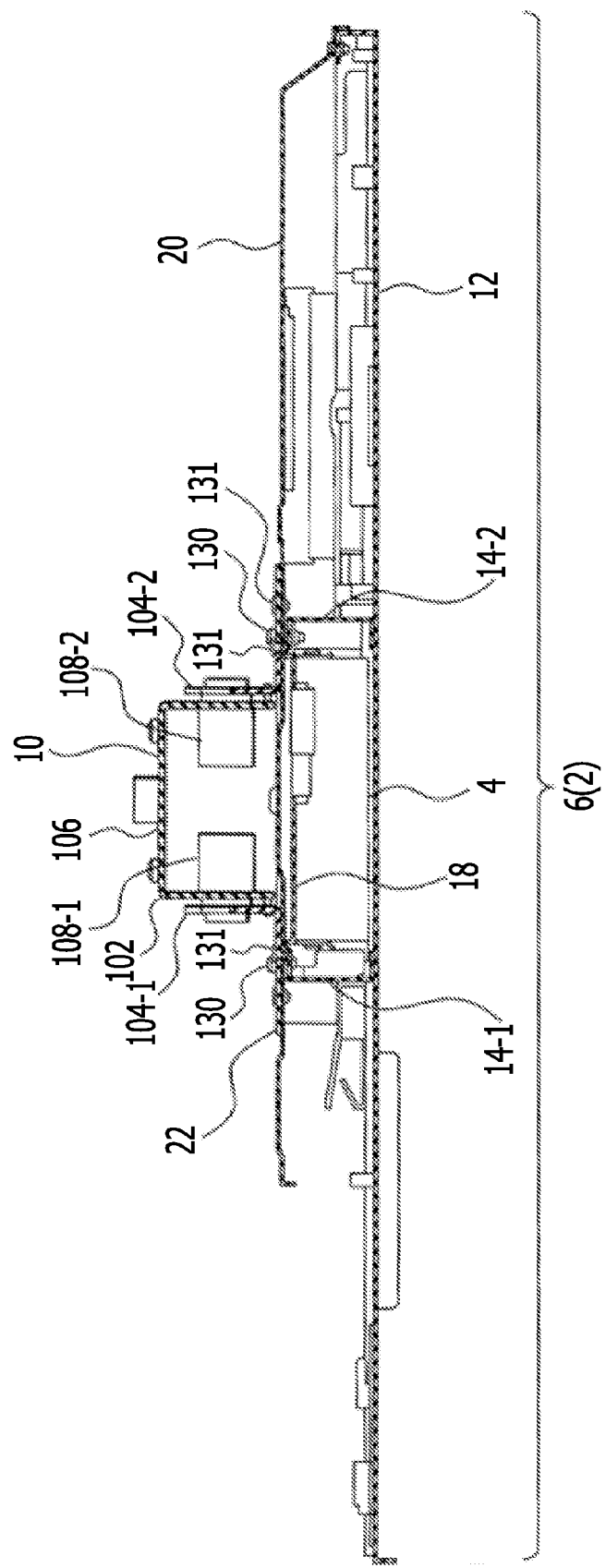
FIG. 21 is a cross sectional view taken along line XXI-XXI in FIG. 18.
Figure 22:
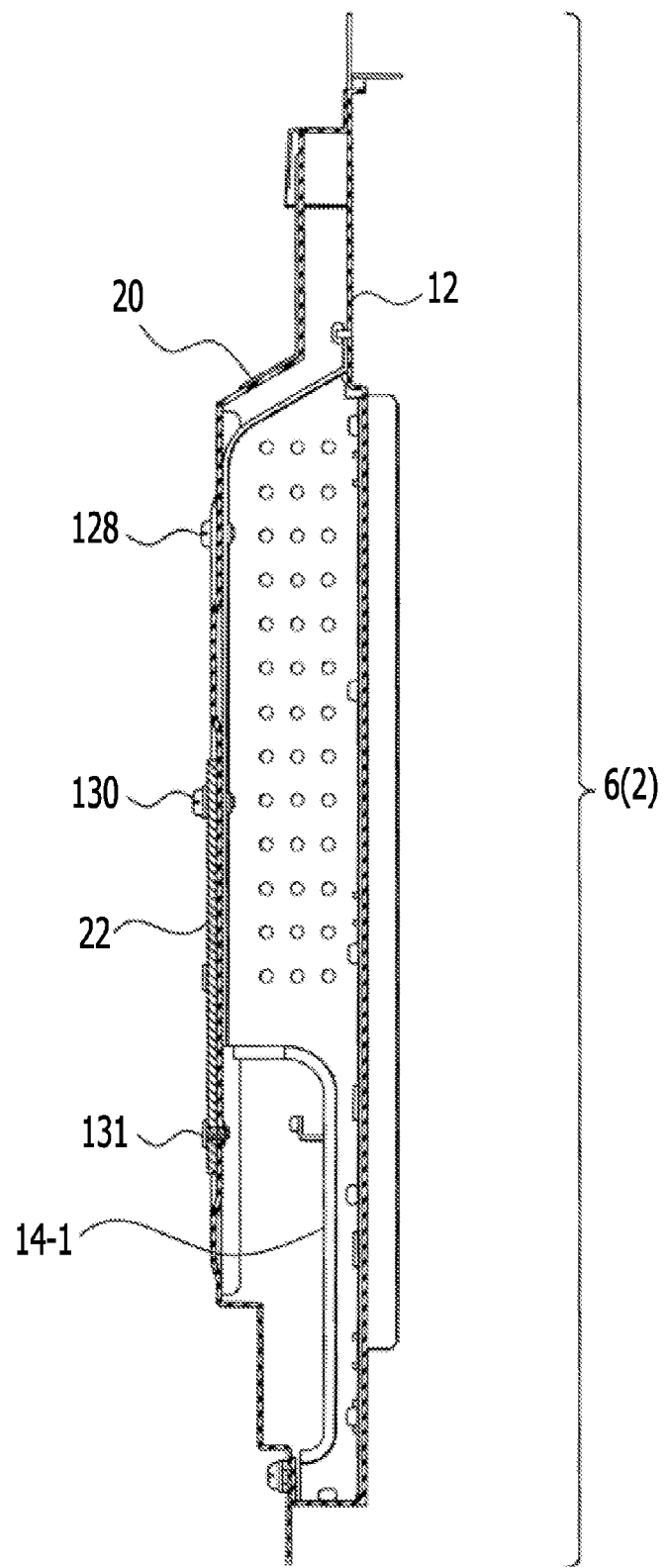
FIG. 22 is a cross sectional view taken along line XXII-XXII in FIG. 18.

FIG. 18 illustrates the shielding frame 20 and hinge 10, which have been secured to the chassis 12. FIG. 19 is a cross sectional view taken along line XIX-XIX in FIG. 18. FIG. 20 is a cross sectional view taken along line XX-XX in FIG. 18. FIG. 21 is a cross sectional view taken along line XXI-XXI in FIG. 18. FIG. 22 is a cross sectional view taken along line XXII-XXII in FIG. 18.

The HDD unit 4 is attached between the support walls 14-1 and 14-2 erected on the central part of the chassis 12 through the bracket 18 by using the screws 130. The shielding frame 20 and hinge frame 22 are placed on the rear surface of the bracket 18 and are secured simultaneously to the support walls 14-1 and 14-2 with the screws 130. The central parts of the hinge frame 22 and shielding frame 20 are secured simultaneously with the screw 132 so as to be integrated.

Figure 23:
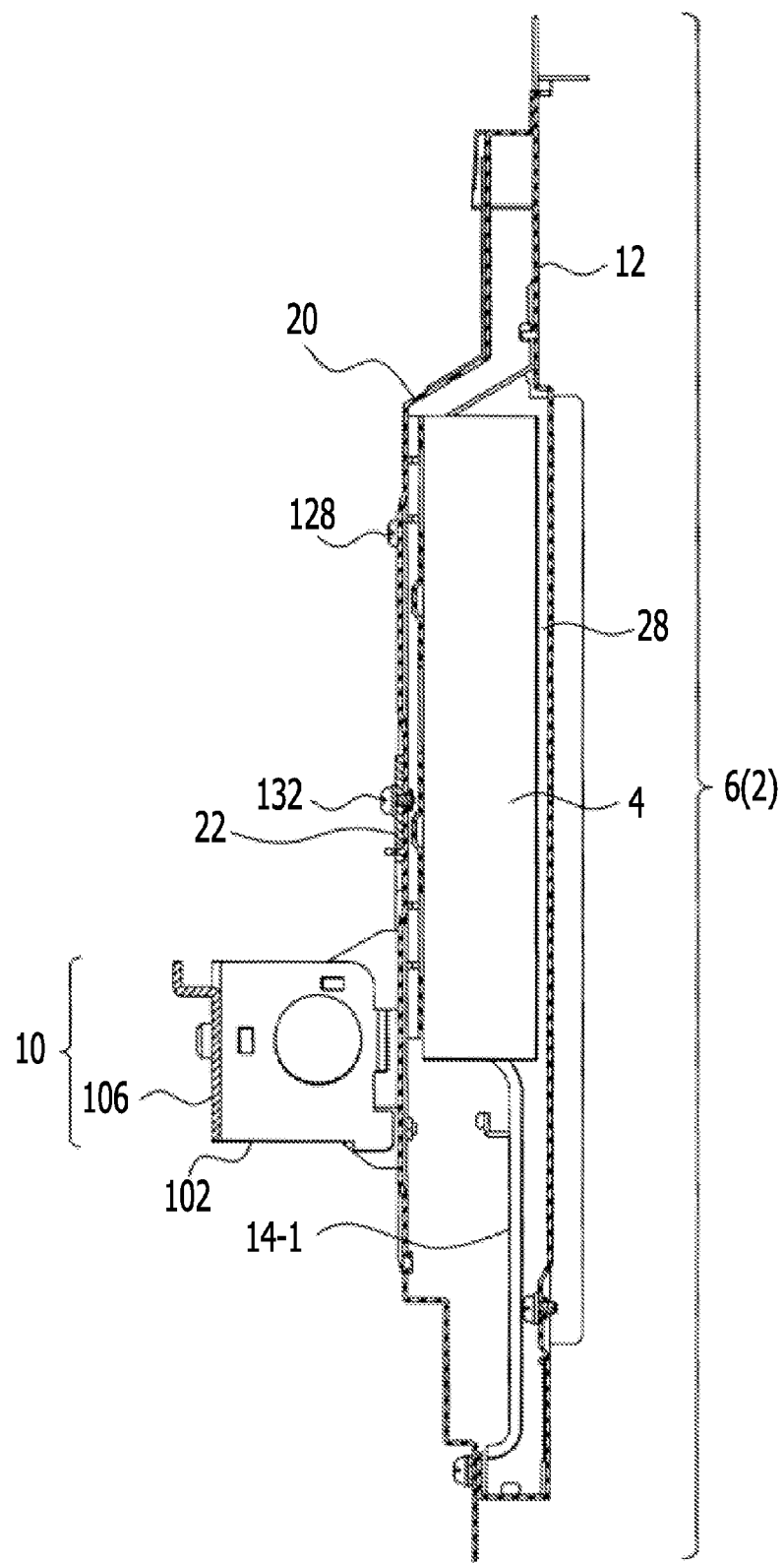
FIG. 23 is a cross sectional view taken along line XXIII-XXIII in FIG. 18.

FIG. 23 is a cross sectional view taken along line XXIII-XXIII in FIG. 18. The HDD unit 4 is secured above the securing position of the hinge 10.

Figure 24:
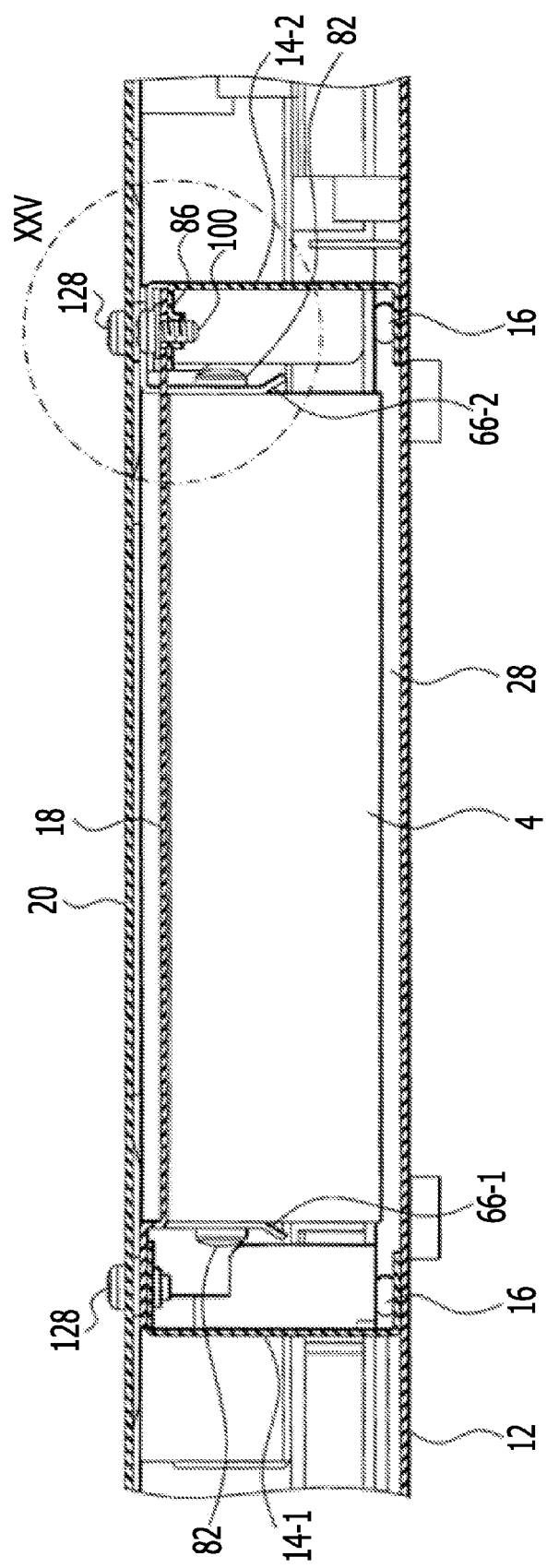
FIG. 24 is a cross sectional view taken along line XXIV-XXIV in FIG. 18.
Figure 25:
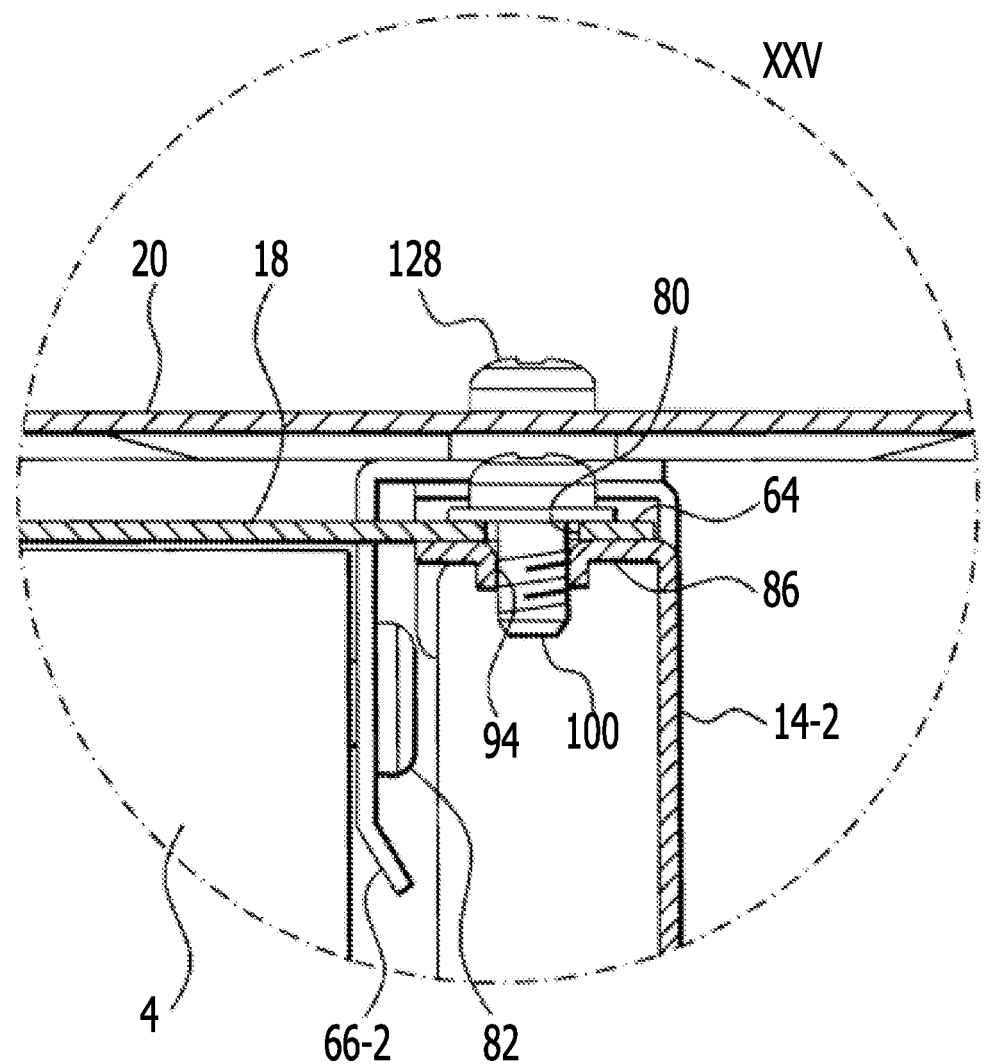
FIG. 25 is an enlarged view of portion XXV in FIG. 24.

FIG. 24 is a cross sectional view taken along line XXIV-XXIV in FIG. 18 and FIG. 25 is an enlarged view of portion XXV in FIG. 24. The bracket 18 attached to the HDD unit 4 is secured to the support walls 14-1 and 14-2, which have been secured to the chassis 12 with the rivets 16, with screws 128. The tentative securing tab 64 of the bracket 18 is placed on the securing part 86 of the support wall 14-2 and is secured with the screw 100.

Figure 26:
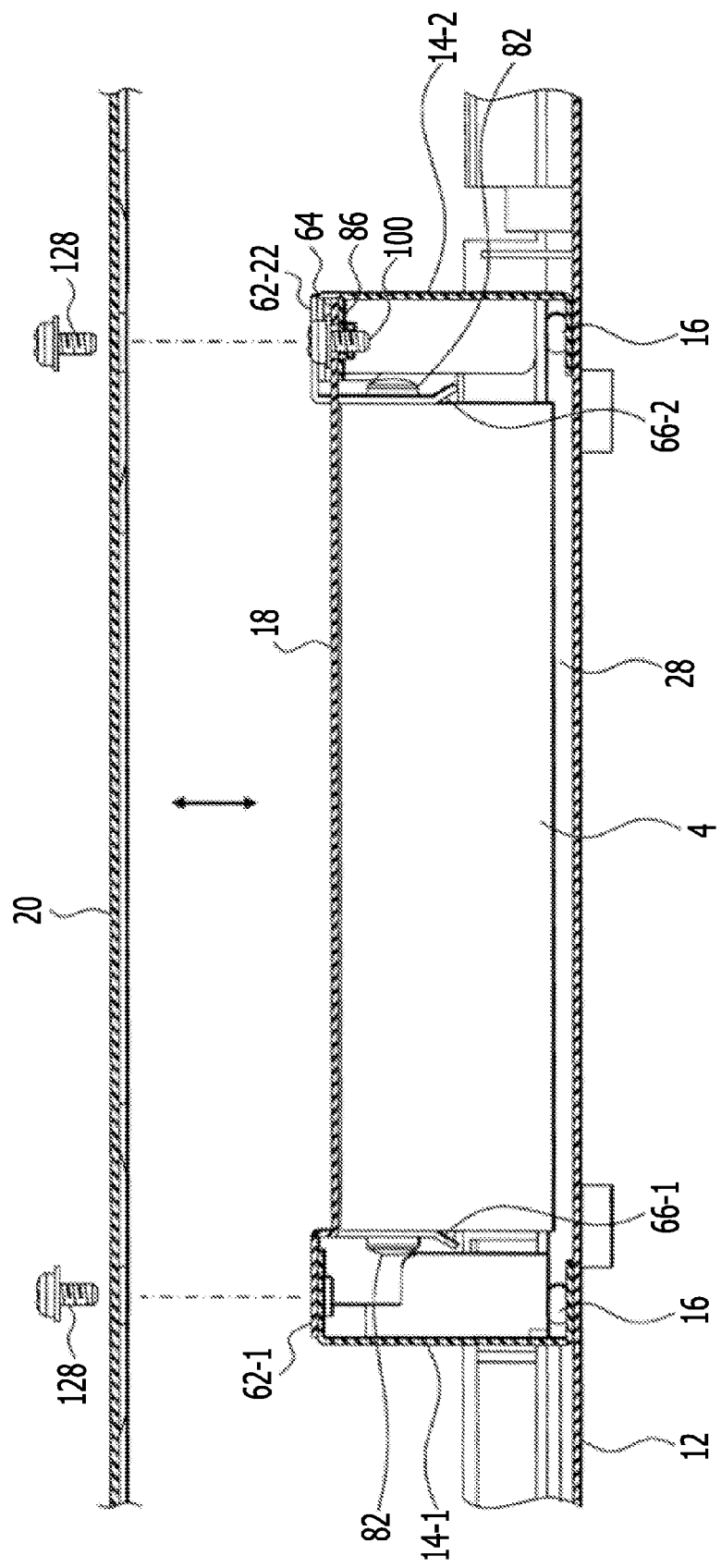
FIG. 26 illustrates how the shielding frame attached and detached.

FIG. 26 illustrates how the shielding frame 20 is attached and detached. Since the tentative securing tab 64 of the bracket 18 has been secured to the securing part 86 of the support wall 14-2 with the screw 100, the shielding frame 20 can be removed from the support walls 14-1 and 14-2 by removing the screws 128. In this case, although not illustrated in FIG. 26, the screws 130 used for simultaneous tightening are removed. That is, the shielding frame 20 can be removed independently of the bracket 18.

In this structure, the HDD unit 4 is positioned by engaging the positioning projection 92-1 on the support wall 14-1 into the through-hole 78-1 in the first securing tab 62-1 of the bracket 18 and engaging the positioning projection 92-2 on the support wall 14-2 into the through-holes 78-2 in the first securing tabs 62-21 of the bracket 18 (this positioning is referred to as burring positioning). Since the HDD unit 4 is tentatively secured with the screw 100, when the main body 6 is separated by the shielding frame 20, it is possible to easily perform operation check of the HDD unit 4, the repair of the HDD unit 4, and the like with the shielding frame 20 removed. This can be done regardless of whether assembling is in progress or the assembling has been completed.

Figure 27:
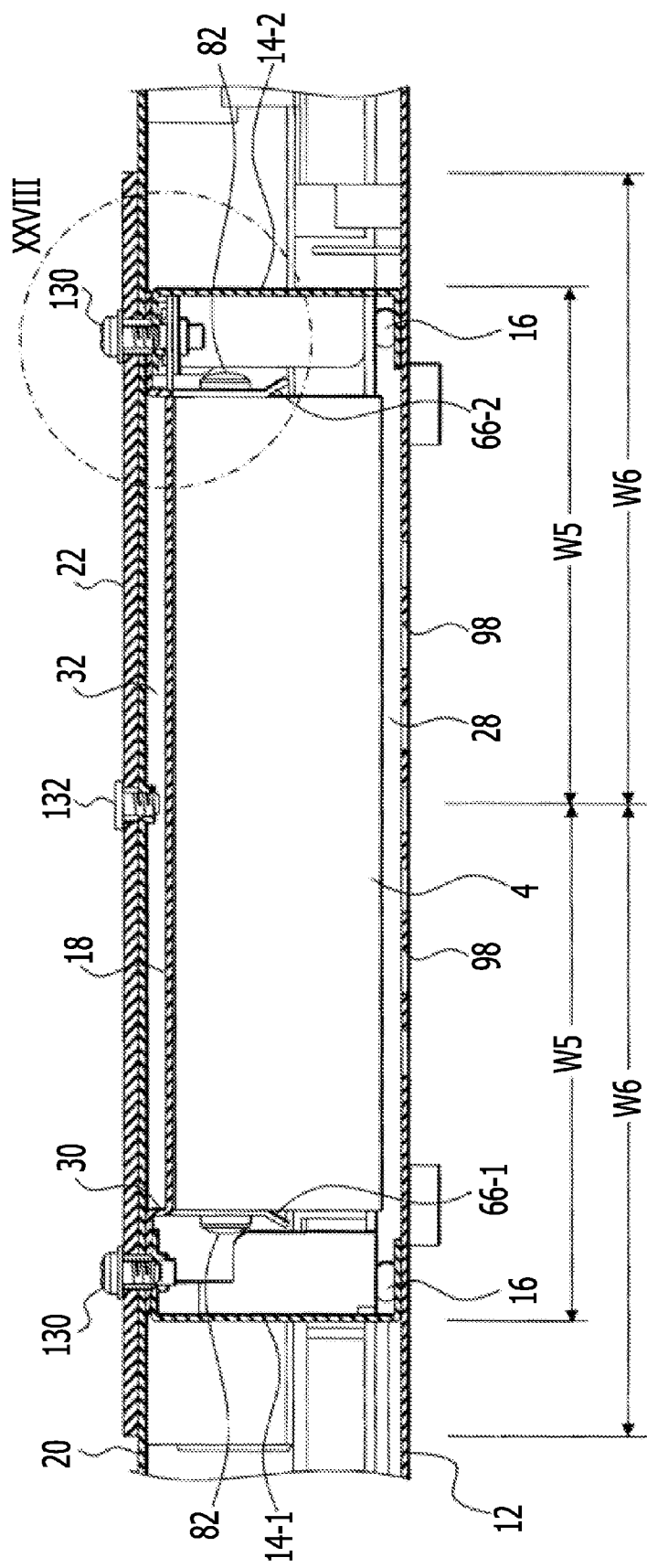
FIG. 27 is a cross sectional view taken along line XXVII-XXVII in FIG. 18.
Figure 28:
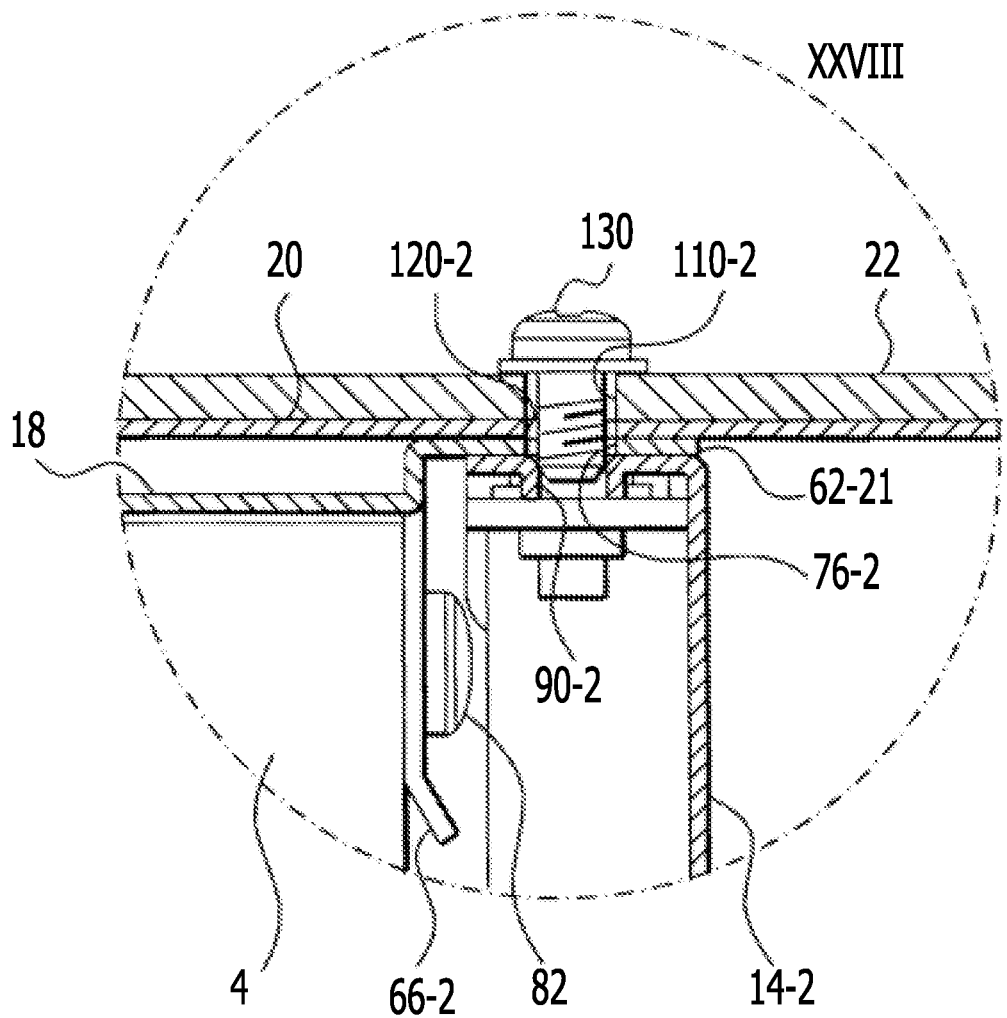
FIG. 28 is an enlarged view of portion XXVIII in FIG. 27.

FIG. 27 is a cross sectional view taken along line XXVII-XXVII in FIG. 18 and FIG. 28 is an enlarged view of portion XXVIII in FIG. 27.

As described above, the HDD unit 4 is tentatively secured to the support walls 14-1 and 14-2 erected on the chassis 12 by using the bracket 18. The shielding frame 20 is placed on the bracket 18 on the support walls 14-1 and 14-2, and the hinge frame 22 is further placed on the shielding frame 20. The shielding frame 20 and hinge frame 22 are positioned by engaging the positioning projection 92-1 on the support wall 14-1 into the through-hole 78-1 in the bracket 18 and through-hole 112-1 in the hinge frame 22 and by engaging the positioning projection 92-2 on the support wall 14-2 into the through-holes 78-2 in the bracket 18 and through-hole 112-2 in the hinge frame 22 before the shielding frame 20 and hinge frame 22 are tightened simultaneously. After this positioning, one screw 130 is inserted into the through-hole 76-1 and through-hole 120-1 and is screwed into the screw hole 90-1 in the support wall 14-1. Similarly, the other screw 130 is inserted into the through-holes 76-2 and through-hole 120-2 and is screwed into the screw hole 90-2 in the support wall 14-2. Accordingly, the bracket 18, shielding frame 20, and hinge frame 22 are secured simultaneously by tightening a single screw 130 for each of the support walls 14-1 and 14-2.

If the width of the hinge frame 22 on the right side and left side from its central line O is W6, the entire width of the hinge frame 22 is W6×2. This width W6×2 has been set so that it is larger than the width setting W5×2 (smaller than W6×2) of the support walls 14-1 and 14-2. Accordingly, the hinge frame 22 bridges the support walls 14-1 and 14-2.

The screw 132 is attached at the center of the shielding frame 20 and hinge frame 22 so that the shielding frame 20 and hinge frame 22 are integrated. The hinge frame 22 reinforces the shielding frame 20 and also suppresses resonance. Although, in this embodiment, the screw 132 is attached on the central line O, it may be attached at a position apart from the central line O. Alternatively, a plurality of screws 132 may be used to secure the hinge frame 22 at several positions.

The space 28 is formed between the HDD unit 4 and the support wall 14-1, between the HDD unit 4 and the support wall 14-2, and between the HDD unit 4 and the chassis 12. The bent portion 30 is formed at the right and left of the bracket 18, which has been secured to the HDD unit 4. Due to the step D of each bent portion 30, the space 32 is formed between the HDD unit 4 with the bracket 18 and the shielding frame 20. That is, the HDD unit 4 supported by the bracket 18 is not in contact with the chassis 12, support walls 14-1 and 14-2, and shielding frame 20. The HDD unit 4 is suspended by the bracket 18 with the cantilever structure and is supported by the frame-based case structure including the shielding frame 20.

Figure 29:
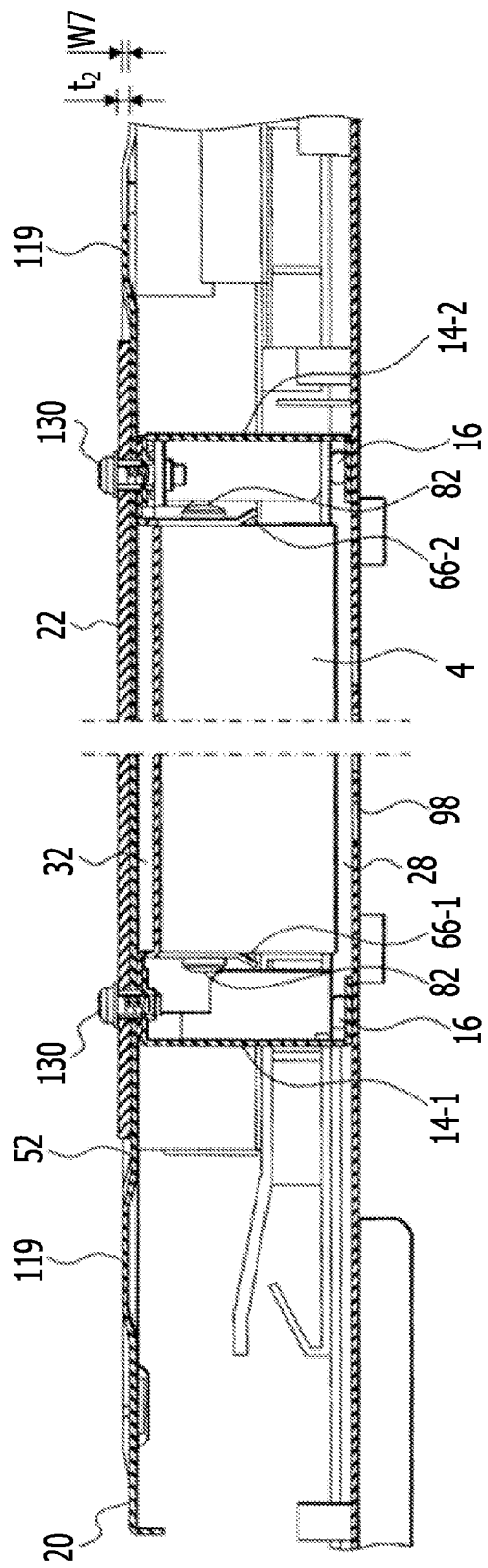
FIG. 29 is a cross sectional view taken along line XXIX-XXIX in FIG. 18 with the central part omitted.

FIG. 29 is a cross sectional view taken along line XXIX-XXIX in FIG. 18 with the central part omitted. The hinge frame 22 is set in the mounting area 52 of the shielding frame 20. The mounting area 52 is enclosed by the rib 119, which is formed by partially evaginating the shielding frame 20 around the hinge frame 22 in a direction toward the rear side. The shielding frame 20 is reinforced by the rib 119 and is strengthen by the attachment of the hinge frame 22. In this embodiment, the amount of projection of the rib 119, which is denoted W7, has been set so that it is smaller than the thickness of $t_2$ of the hinge frame 22 (W7<$t_2$). The amount of projection of the hinge frame 22, which is thick, from the rear surface of the shielding frame 20 is reduced by the rib 119. In this case, the amount W7 of projection of the rib 119 is larger than the thickness of $t_2$ of the hinge frame 22, the hinge frame 22 can be accommodated inside the vertex surface of the rib 119.

Figure 30:
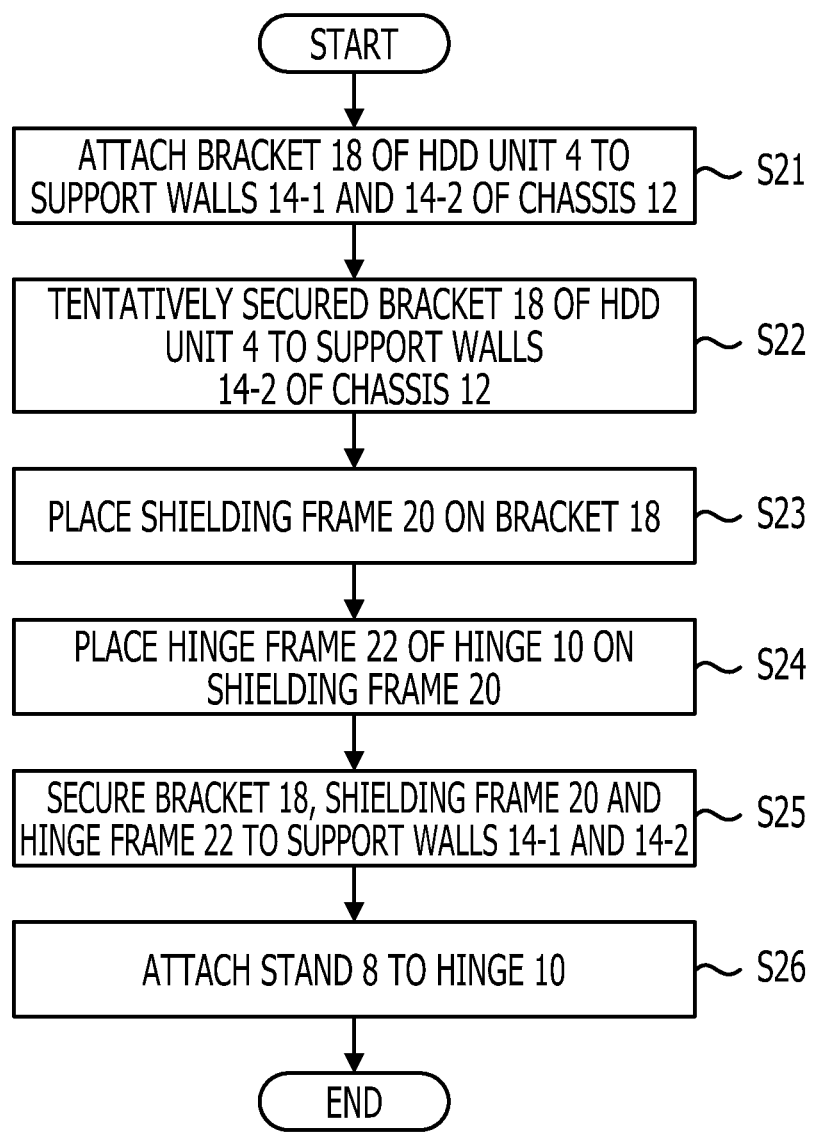
FIG. 30 is a flowchart illustrating an assembling procedure in the second embodiment.

FIG. 30 illustrates an assembling procedure in the second embodiment. This assembling procedure is an example of a method of manufacturing the electronic apparatus in this disclosure, but the method of manufacturing the electronic apparatus in this disclosure is not limited to the assembling procedure.

In this assembling procedure, the chassis 12 and support walls 14-1 and 14-2 are formed by metal sheet processing. The support walls 14-1 and 14-2 are secured to the chassis 12 with the rivets 16. The bracket 18 is attached to the HDD unit 4 in advance. The bracket 18 attached to the HDD unit 4 is attached to the support walls 14-1 and 14-2 (S21).

The bracket 18 attached to the HDD unit 4 is tentatively secured to the support wall 14-2 with the screw 100 (S22).

The shielding frame 20 is placed on the bracket 18 attached to the HDD unit 4, which has been placed on the support wall 14-2 (S23).

The hinge frame 22 of the hinge 10 is placed on the shielding frame 20 (S24). The screws 128, 130, 131, and 132 are secured from the rear surface of the hinge frame 22. Thus, the bracket 18, shielding frame 20, and hinge frame 22 are secured to the support walls 14-1 and 14-2 (S25). In this case, the bracket 18, shielding frame 20, and hinge frame 22 are secured simultaneously to the support walls 14-1 and 14-2 with the screws 130.

The stand 8 is attached to the hinge 10 (S15). This completes the assembling of the PC 2.

Figure 31:
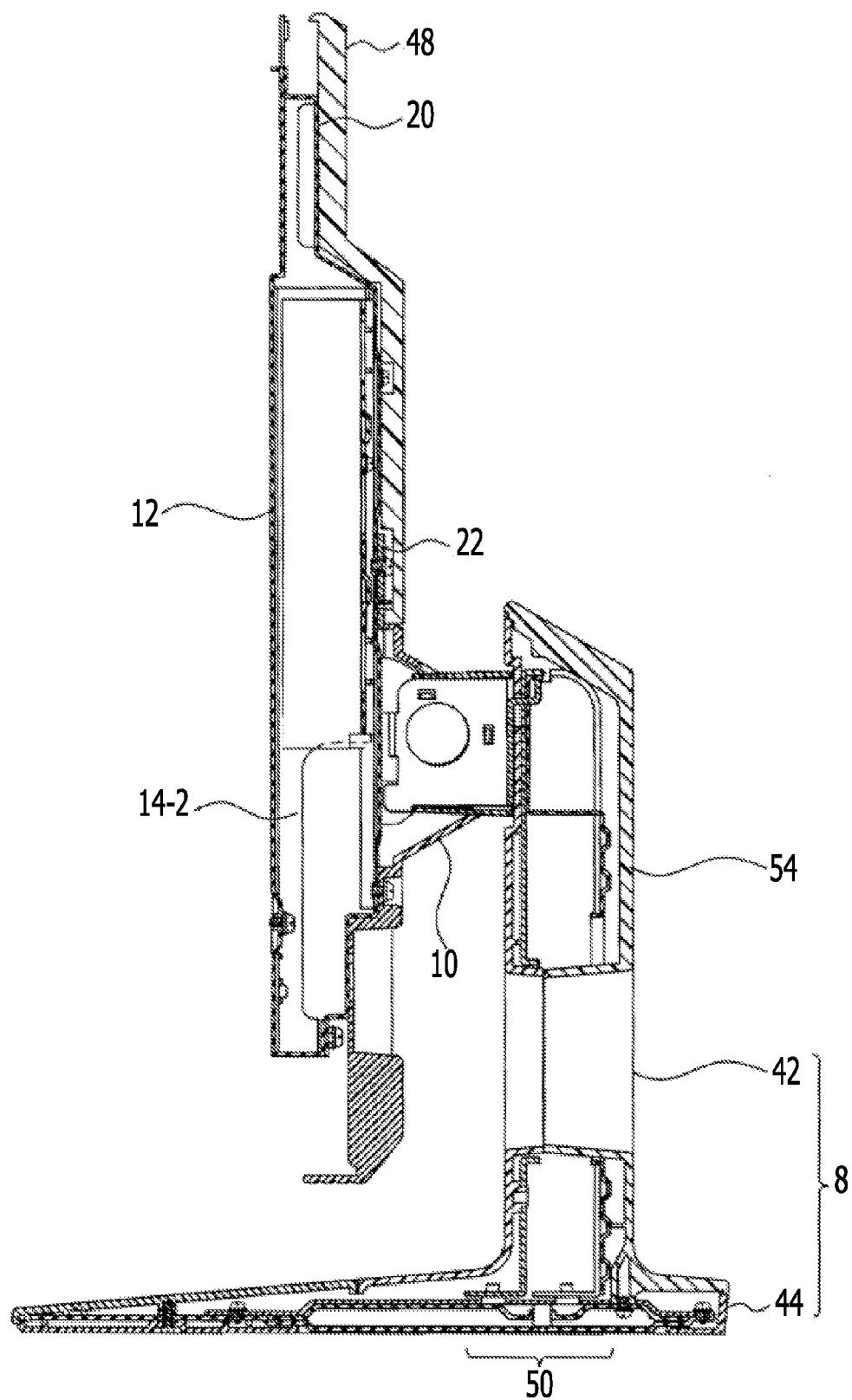
FIG. 31 is a cross sectional view taken along line XXXI-XXXI in FIG. 5 with the front cover and LCD unit removed.
Figure 32:
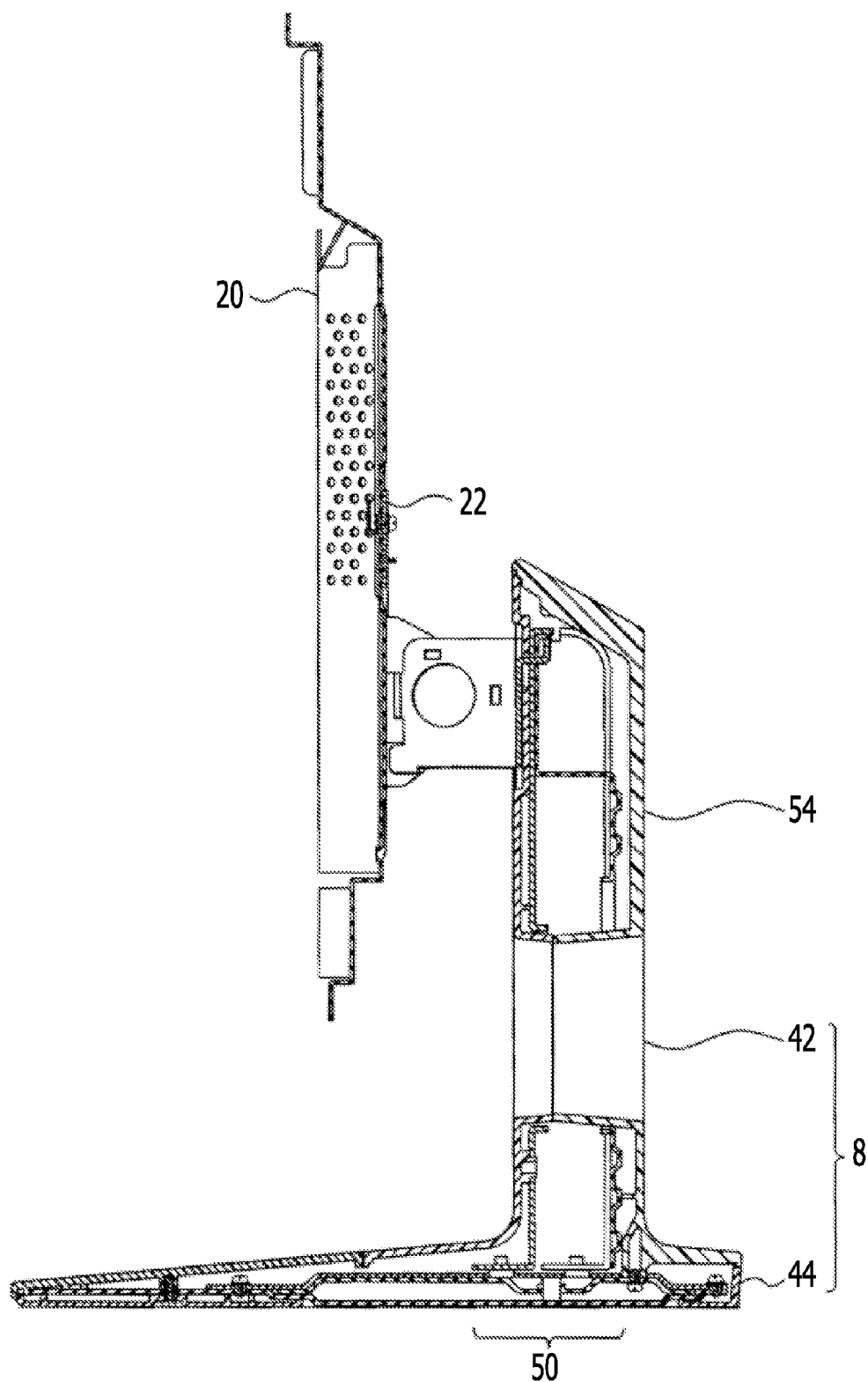
FIG. 32 is a cross sectional view taken along line XXXII-XXXII in FIG. 5 with the front cover, LCD unit, and HDD unit removed.

FIG. 31 is a cross sectional view taken along line XXXI-XXXI in FIG. 5 with the front cover and LCD unit removed, and FIG. 32 is a cross sectional view taken along line XXXII-XXXII in FIG. 5 with the front cover, LCD unit, and HDD unit removed.

The front cover 34 and LCD unit 38 can be removed from the main body 6 by removing the screws that secure them, so the LCD unit 38 can be easily replaced or inspected. During the replacement or inspection, the chassis 12 can be supported by the stand 8. Parts on the chassis 12 can be replaced or inspected. That is, the stand 8 can remain attached.

When the shielding frame 20 is separated from the chassis 12, the shielding frame 20 can be left on the same side as the stand 8 as illustrated in FIG. 32. The HDD unit 4 remains attached to the chassis 12 separated from the shielding frame 20, so maintenance of the HDD unit 4 such as replacement and adjustment can be easily carried out.

Advantageous Effect of the Second Embodiment (1) The space 32 is formed between the HDD unit 4 and the shielding frame 20 due to the bent portions 30 formed on the bracket 18. That is, the space 32 separates the HDD unit 4 from the shielding frame 20. Therefore, direct transmission of vibration to the shielding frame 20 can be suppressed, the mechanical strength of the bracket 18 is increased by the bent portions 30, and thereby the vibration isolation property of the HDD unit 4 and bracket 18 is improved.

(2) When the HDD unit 4 is attached, it is tentatively secured to the support wall 14-2 with the screw 100 through the tentative securing tab 64. When the HDD unit 4 is removed, it remains secured to the support wall 14-2 due to the screw 100. This suppresses the HDD unit 4 from dropping when, for example, the HDD unit 4 is secured to the main body 6 or is serviced after being assembled, simplifying the assembling and maintenance of the HDD unit 4.

(3) The tentative securing tab 64 is formed at a position lower than the first securing tabs 62-21 and 62-22. That is, the tentative securing tab 64 is flush with the bracket main body 60. The screw 100 secures the HDD unit 4 to the support wall 14-2 at a position lower than the first securing tabs 62-21 and 62-22, that is, on a plane recessed from the first securing tabs 62-21 and 62-22. This solves the problem with the interference between a combination of the chassis 12 and hinge frame 22 and the bracket main body 60. That is, thinning is possible by an amount equal to the height of the head of the screw 100 for the HDD unit 4 and bracket 18.

(4) The positioning projection 92-1 is formed on the support wall 14-1 and the positioning projection 92-2 is formed on the support wall 14-2, the support walls 14-1 and 14-2 being placed in parallel, enabling the precise positioning of the bracket 18 attached to the HDD unit 4, the shielding frame 20, and the hinge frame 22. The positioning projections 92-1 and 92-2 are formed by burring. A strong case structure and a securing strength are obtained from engagement of the positioning projections 92-1 and 92-2 into the bracket 18 attached to the HDD unit 4, into the shielding frame 20, and into the hinge frame 22 and by integral tightening with the screws 130.

(5) The bracket 18 is secured to the HDD unit 4 by clamping its side surfaces between the second securing tabs 66-1 and 66-2, which are formed from the bracket main body 60 by lugging. This securing structure not only can reduce the size and weight but also can improve resistance to vibration caused by the HDD unit 4, as compared with a conventional a box-type structure.

(6) The bracket 18 attached to the HDD unit 4 is secured to the support walls 14-1 and 14-2 with the screws 130, so only the bracket 18 is brought into contact with the chassis 12. That is, the use of rubber bushings, gaskets, and other parts that suppress vibration can be excluded.

(7) The HDD unit 4 can be secured and harsh sounds can be suppressed without the use of special parts that suppress vibration, so the number of parts that suppress vibration can be reduced.

(8) Stability in contact can be improved as compared with the conventional structure in which gaskets are disposed between the chassis and the bracket to which the HDD unit has been attached. Accordingly, vibration sounds can be reduced, which are generated at the clamping portions due to changes of spaces depending on the height of a drawn metal sheet, the stability of bends, warps, and the like. Therefore, the problem with the conventional clamping structure in that, although the contact area of the tightening part is small and the securing force is small, vibration is difficult to reduce can be solved.

Figure 33:
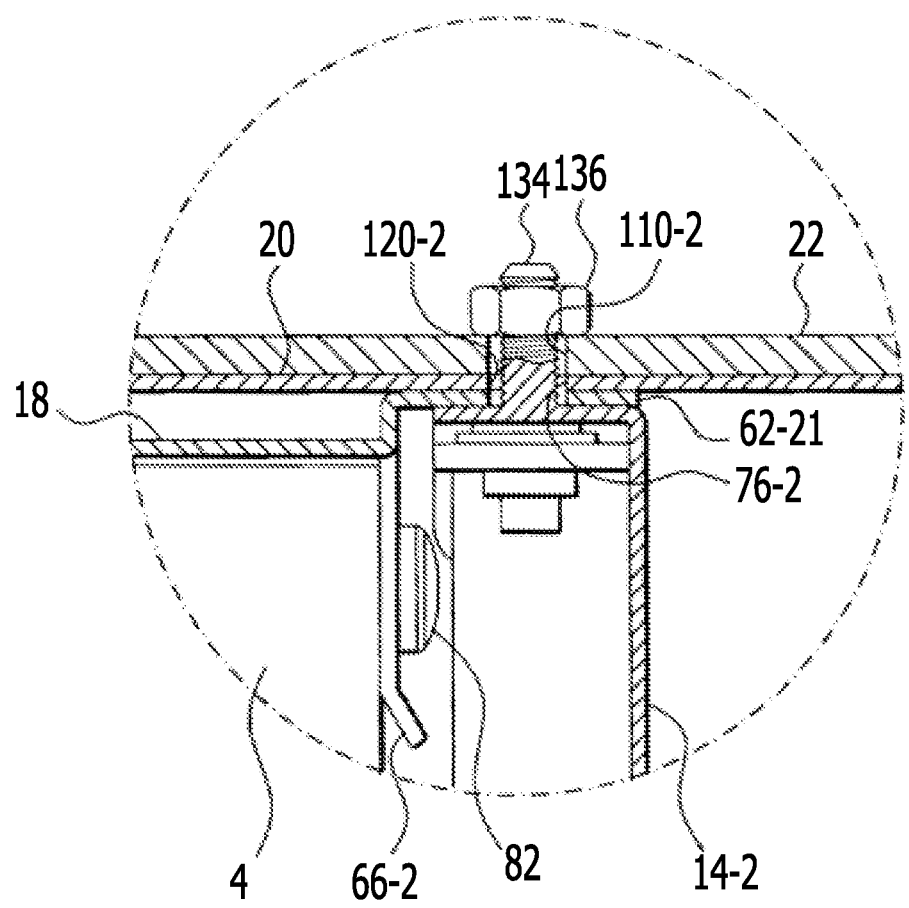
FIG. 33 is a cross sectional view of a variation of simultaneous tightening.

Other Embodiments (1) FIG. 33 illustrates a variation of simultaneous tightening. In FIG. 33, the same elements as in FIG. 28 are indicated by the same reference numerals. Although the screws 130 have been used in the second embodiment, screws 134 may be attached to the support walls 14-1 and 14-2 instead of the screws 130. Each screw 134 may be passed through the bracket 18, shielding frame 20, and hinge frame 22 to tighten them simultaneously by attaching a nut 136 to the screw 134. In this structure as well, the same advantageous effect can be obtained.

(2) Although, in the above embodiments, the PC 2 has been exemplified as the electronic apparatus, an electronic apparatus other than PCs is also applicable. Although the HDD unit 4 has been exemplified as the vibrating component, a part having a vibrating structure other than the HDD unit 4 is also applicable.

(3) Although, in the above embodiments, a structure in which the shielding frame 20 and hinge frame 22 are attached together to the chassis 12 has been exemplified, this is not a limitation; a structure in which the HDD unit 4 is suspended to the bracket 18 and attached to the frame structure of the main body 6 with screws may be used. When only the bracket 18 is brought into contact with the HDD unit 4, contact of the HDD unit 4 with the main body 6 can be suppressed and the problem of the vibration of the HDD unit 4 can be solved.

(4) Although, in the above embodiments, the shielding frame 20 has been secured to the support walls 14-1 and 14-2, which is an example of the support part, the shielding frame 20 may be secured to the chassis 12. That is, the shielding frame 20 may be secured to any one or both of the support walls 14-1 and 14-2. Although the shielding frame 20 has contactlessly covered the HDD unit 4, which is a vibrating component, the bracket 18 may be exposed from the shielding frame 20 and the shielding frame 20 may cover only the chassis 12.

(5) The bracket 18 may be a shield member for the HDD unit 4.

The most preferable embodiments and the like of the electronic apparatus and its manufacturing method in this disclosure have been described. This disclosure is not limited to the above descriptions. Those skilled in the art can make many variations and changes according to the spirit and scope of the disclosure described in the embodiments. It will be appreciated that these variations and changes are included in the range of this disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
a main body;
a hinge through which the main body is attached to a stand;
a chassis including a support portion that is attached to the hinge;
a vibrating component to which a bracket is attached, the vibrating component being attached to the support portion through the bracket; and
a shielding member that is attached to the chassis to cover the chassis without coming into contact with the vibrating component,
wherein the bracket and shielding member are interdisposed between the hinge and the support portion, and
wherein the vibrating component is housed entirely in an area formed between the shielding member and a surface of the chassis.

2. The electronic apparatus according to claim 1, wherein at least two of the bracket, the shielding member and the hinge are secured to the support portion.

3. The electronic apparatus according to claim 1, wherein the vibrating component is disposed between the chassis and the shielding member with a space interposed therebetween.

4. The electronic apparatus according to claim 1, wherein the vibrating component is supported by the bracket without coming into contact with the chassis and the shielding member.

5. The electronic apparatus according to claim 1, wherein the hinge includes a hinge frame formed with a material that is at least twice as thick as the shielding member.

6. The electronic apparatus according to claim 1, wherein the vibrating component is a hard disk drive unit.

7. The electronic apparatus of claim 1, wherein the support portion comprises a pair of support walls which are erected orthogonally from a plane of the chassis, wherein the bracket, shielding member and hinge are all secured to the pair of support walls.

8. The electronic apparatus of claim 1, wherein the hinge attaches to a rear surface of the shielding member.

9. A method of manufacturing an electronic apparatus, the method comprising:
forming a chassis including a support portion that supports a hinge through which a main body of the electronic apparatus is attached to a stand;
attaching a vibrating component to the support portion through a bracket attached to the vibrating component; and
attaching a shielding member to the chassis such that the shielding member covers the chassis without coming into contact with the vibrating component,
wherein the bracket and shielding member are interdisposed between the hinge and the support portion, and
wherein the vibrating component is housed entirely in an area formed between the shielding member and a surface of the chassis.

10. The method of claim 9, wherein the support portion comprises a pair of support walls which are erected orthogonally from a plane of the chassis, wherein the bracket, shielding member and hinge are all secured to the pair of support walls.

11. The method of claim 7, wherein the hinge attaches to a rear surface of the shielding member.

* * * * *